United States Patent [19]

Rentzepis

[11] Patent Number: 5,268,862
[45] Date of Patent: Dec. 7, 1993

[54] THREE-DIMENSIONAL OPTICAL MEMORY

[75] Inventor: Peter M. Rentzepis, Irvine, Calif.

[73] Assignee: The Regents of the Unversity of California, Alameda, Calif.

[21] Appl. No.: 342,978

[22] Filed: Apr. 25, 1989

[51] Int. Cl.[5] .............................. G11C 11/00
[52] U.S. Cl. ....................................... 365/151
[58] Field of Search .......................... 365/151

[56] References Cited

U.S. PATENT DOCUMENTS

| | | |
|---|---|---|
| 3,119,099 | 1/1964 | Biernat .................. 365/151 |
| 3,508,208 | 4/1970 | Duguay et al. .......... 340/173 |
| 4,238,840 | 12/1980 | Swainson et al. . |
| 4,288,861 | 9/1981 | Swainson et al. .......... 365/127 |
| 4,333,165 | 6/1982 | Swainson et al. . |
| 4,466,080 | 8/1984 | Swainson et al. . |
| 4,471,470 | 9/1984 | Swainson et al. . |

OTHER PUBLICATIONS

"Two-Photon Processes and their Applications", M. P. McCann et al., Photonics Spectra, Mar. 1989, pp. 109-114.

"Is Optical Holography the Answer?", T. K. Gaylord, Optical Spectra, 6, 25 (1972).

Primary Examiner—David Cain
Attorney, Agent, or Firm—Fuess, Davidenas & Meadows

[57] ABSTRACT

An active medium, typically a photochromic material and more typically spirbenzopyran, maintained in a three-dimensional matrix, typically of polymer, is illuminated in selected regions by two UV laser light beams, typically of 532 nm. and 1064 nm. wavelength, to change from a first, spiropyran, to a second, merocyanine, stable molecular isomeric form by process of two-photon absorption. Regions not temporally and spatially coincidently illuminated are unchanged. Later illumination of the selected regions by two green-red laser light beams, typically of 1064 nm wavelength each, causes only the second, merocyanine, isomeric form to fluoresce. This fluorescence is detectable by photodetectors as stored binary data. The three-dimensional memory may be erased by heat, or by infrared radiation, typically 2.12 microns wavelength. Use of other medium permit the three-dimensional patterning of three-dimensional forms, such as polystyrene polymer solids patterned from liquid styrene monomer. Three-dimensional displays, or other inhomogeneity patterns, can also be created.

78 Claims, 6 Drawing Sheets

↕ } INDICATES THE
⊙ } LINEAR POLARIZATION

THREE-DIMENSIONAL OPTICAL MEMORY

BACKGROUND OF THE INVENTION

1. Field of the Invention

The present invention generally concerns three-dimensional optical memory apparatus and memory media, and methods of using such apparatus and media. The present invention particularly concerns (i) three-dimensional memories using at least two intersecting beams of radiation, (ii) the manner of using the intersecting beams and the physical and/or chemical effects of such use, and (iii) the construction of binary-stated informational memory stores, three-dimensional patterns, and/or three dimensional displays based on these effects.

2. Backcround of the Invention

The need for computerized data storage and processing has been increasing, in the past decade, at a high rate. In response to this need, semiconductor-based computer technology and architecture have greatly improved. However, increasing size and price may now be limiting still more widespread usage of high performance computers.

The major determinant of the size and price of high performance computers is the memory. The data storage requirements of new high performance computers are very great, typically many gigabytes ($10^{12}$ bits) New and improved, compact, low cost, very high capacity memory devices are needed. These memory devices should be able to store many many gigabytes of information, and should randomly retrieve such information at the very fast random access speeds demanded by parallel computing.

An optical memory offers the possibility of packing binary-stated information into a storage medium at very high density, each binary bit occupying a space only about one wavelength in diameter. When practical limitations are taken into account this leads to a of about total capacity of about $10^{11}$ bits for a reasonably-sized two-dimensional optical storage medium—the amount of information contained in about 3000 normal size books. A comparison of the optical memory to existing types of computer memories is contained in the following Table 1.

TABLE 1

| MEMORY TYPE | CAPACITY | ACCESS TIME | COST |
|---|---|---|---|
| TAPE | $10^{10}$ bits | 100 sec | $10^{-5}$¢/bit |
| DISK | $10^8$ bits | 300 msec | $5 \times 10^{-2}$¢/bit |
| DRUM | $10^7$-$10^8$ bits | 10 msec | $10^{-2}$¢/bit |
| CORE | $10^6$ bits | 1 μsec | 2¢/bit |
| SEMI-CONDUCTOR | $10^5$ bits | 100 nsec | 20¢/bit |
| OPTICAL | $10^9$-$10^{12}$ bits | 10 nsec | $10^{-3}$-$10^{-4}$¢/bit |

The present invention will be seen to be embodied in a 3-D optical memory which may be used in an optical memory system. Any optical memory, 3-D or otherwise, is based on light-induced changes in the optical, chemical and/or physical properties of materials.

At the present two general classes of optical recording media exist, namely phase recording media and amplitude recording media. The first are based on light-induced changes of the index of refraction (i.e., phase holograms) whereas the second refer to photo-induced changes in the absorption coefficient (i.e., hole burning).

Volume information storage is a particularly attractive concept. In a two dimensional memory the theoretical storage density (proportional to $1/\lambda^2$) is $1 \times 10^{11}$ bits/cm$^2$ for $\lambda = 266$ nm. However in a 3-D memory the theoretical storage density is $5 \times 10$pgy 16 pk bits/cm$^3$. Thus the advantages of 3-D data storage versus previous two dimensional information storage media become apparent.

Volume information storage has been implemented by holographic recording in phase recording media. Reference F. S. Chen, J. T. LaMacchia and D. B. Fraser, *Appl. Phys. Lett.*, 13, 223 (1968); T. K. Gaylord, *Optical Spectra*, 6, 25 (1972); and L. d'Auria, J. P. Huignard, C. Slezak and E. Spitz, *Appl. Opt.*, 13, 808 (1974).

The present invention will be seen to implement volume writable-readable-erasable optical storage in an amplitude recording medium. One early patent dealing with three-dimensional amplitude-recording optical storage is U.S. PAT. No. 3,508,208 for an OPTICAL ORGANIC MEMORY DEVICE to Duguay and to Rentzepis, the selfsame inventor of the present invention. Duguay and Rentzepis disclose an optical memory device including a two-photon fluorescent medium which has been solidified (e.g., frozen or dispersed in a polymer). Information is written into a selected region of the medium when a pair of picosecond pulses are made to be coincident and to overlap within the selected region. The overlapping pulses create, by two-photon absorption, organic free radicals which store the information at an energy level intermediate the fluorescent level and the ground state. The radicals store the desired information for short time, until they recombine. The information may be read out by interrogating the medium with a second pair of coincident and overlapping picosecond pulses. In the case where the medium is frozen, interrogation may also be accomplished by directing a collimated infrared light beam into the selected region, thereby causing that region to liquefy and its associated radicals to undergo recombination. In each of the aforementioned cases, the interrogate beam causes the interrogated region to fluoresce. The emitted radiation is sensed by an appropriate light detector as an indication of the informational contents of the interrogated region.

This early optical memory of Duguay and Rentzepis recognizes the use of two-photon absorption only to produce excited states (e.g., singlet, doublet or triplet states) of the medium over the ground state. These excited states are metastable. For example, one preferred fluorescent medium is excitable from ground to a singlet state (by two-photon absorption in about $10^{-15}$ sec.) where it will remain about $10^{-8}$ second before fluorescing to assume a metastable triplet state. This metastable state represents information storage. Alas, it will spontaneously decay to the ground state by fluorescence after about 1 sec. (depending on temperature). The memory is thus unstable. It should be understood that the fluorescent medium of the memory is at all times the identical molecular material, and simply assumes various excited energy states.

Another previous optical system for accomplishing the volume storage of information, and other purposes, is described in the related series of U.S. Pat. Nos. 4,078,229; 4,333,165; 4,466,080; and 4,471,470 to Swainson, et al. and assigned to Formigraphic Engine Corporation. The Swainson, et al. patents are variously concerned with three-dimensional systems and media for optically producing three-dimensional elements including (i) controlled refractive index distributions, (ii) complex patterns and shapes, or (iii) physio-chemical inhomogeneities for storing data. The Swainson, et al. patents generally concern the idea that some sort of chemical reaction between two or more reactive components should be radiatively induced at selected cell sites of a 3-D memory in order to produce a stable, changed, state at these selected sites.

U.S. Pat. No. 4,471,470, in particular, describes a METHOD AND MEDIA FOR ACCESSING DATA IN THREE-DIMENSIONS. Two intersecting beams of radiation are each matched to a selected optical property or properties of the active media. In one embodiment of the method and media, called by Swainson, et al. "Class I systems", two radiation beams generate an active region in the medium through simultaneous action. Two components are typically incorporated within the medium. Both components are radiation sensitive, but to different spectral regions. The two radiation beams intersecting in a volume each produce, in parallel, an associated chemical product. The two products that are simultaneously present in the intersection region chemically react to form a desired sensible object, which may represent a binary bit of information. One or both of the radiation-induced chemical products desirably undergoes a rapid reverse reaction in order to avoid interference effects and in order to permit the three-dimensional media to be repetitively stored.

In other embodiment, called "Class II systems", one of the radiation beams must act on a component of the medium before the medium will thereafter be responsive to the other radiation beam. The class I and class II systems thusly differ by being respectively responsive to the effects of simultaneously, and sequentially, induced photoreactions.

The Swainson, et al. patents—including those patents that are not directed to information storage and that are more particularly alternatively directed to making optical elements having inhomogeneity of their refractive index, or to making physical shapes and patterns—are directed to inducing changes in a bulk media by impingent directed beams of electromagnetic radiation, typically laser light, in order that selected sites within the bulk media may undergo a chemical reaction. There are a large number of photosensitive substances that are known to undergo changes in the presence of light radiation, and the changed states of these substances are, in many cases, chemically reactive. The patents of Swainson, et al. include a great number of these photosensitive and photoreactive substances, which substances may generally also be identified from a search of the literature.

Swainson, et al. also recognize that molecular excitation from a ground state to an excited state may occur following the stepwise absorption of two photons. Swainson, et al. call this "two-photon absorption". Swainson, et al. describe that a solution of 8' allyl-6' nitro-1, 3, 3-trimethylspiro(2' N-1-benzopyran-2'-2-indoline) in benzene may be exposed to intersecting synchronized pulsed ruby laser beams transmitted through an UV elimination filter to form, at the region of intersection, a spot of color. The process of stepwise absorption of two photons in this solution, and in others, is recognized by Swainson, et al., only to produce an excited state that may form (as in the example) colored products, or which may serve as an energy transfer agent.

In making all manner of excited states—including singlet, doublet, triplet, and quartet states—the patents of Swainson, et al. describe known photochemistry. Generally chemistry, and photochemistry, that is known to work in one dimension is equally applicable in three dimensions. It is known that an electron may be knocked off an active substance so that it becomes an ion. It is known that radiation may cause a substance to dissociate a proton, again becoming an ion. It is even known how to induce spin changes and changes in parity by electromagnetic radiation. Once these changes, or others, are induced then Swainson, et al. rely on the transportive capabilities of the liquid or gaseous support media to permit a chemical reaction to transpire.

The present invention will be seen to reject this approach of inducing chemical reactions in a 3-D medium by creating one or more of the reagents with radiation. One reason why the present invention does so is because the same support medium, or matrix, that offers the transportive capabilities that are absolutely necessary to permit the chemical reactions to occur also permit, at least over time, that reagents or reaction products will migrate in three dimensions, destroying the integrity of the inhomogeneity pattern.

The three-dimensional systems of Swainson, et al., and all other such systems which the inventor is aware, fail to recognize, in combination, exactly what an active media should be, and exactly how such active media should be dealt with, in order that the active media have both (i) two stable states, which may be (ii) entered into, and subsequently interrogated, in some particular radiation-induced manner. To repeat, the existence of radiation-induced stable states in certain photoactive substances is previously known. Likewise, the manner of manipulating photoactive substances, including by the process of two-photon absorption, is also previously known. What is not known is how to put (i) the right photoactive substance undergoing the right type of transformation together with (ii) the right method for inducing such transformation and for interrogating the results thereof, in order to effectively produce usable and stable inhomogeneity patterns in a three-dimensional medium. That is the subject of the present invention.

SUMMARY OF THE INVENTION

The present invention contemplates selectively inducing isomeric changes in the molecular isomeric form of selected regions within a three-dimensional active medium by the process of two-photon absorption.

The method of the invention produces a three-dimensional inhomogeneity pattern in a volume of active media in response to directed electromagnetic radiation. In order to do so, an active medium having at least two isomeric molecular forms is contained within a volume. The active medium in accordance with the invention is responsive to energy level changes stimulated by electromagnetic energy to change from one of its isomeric molecular forms to another of its isomeric molecular forms. A selected portion of the active medium is selectively radiated with plural directed beams of electromagnetic radiation to change the selected portion from the one isomeric molecular form to the other isomeric molecular form by process of plural-photon absorption.

The induced isomeric changes possess useful optical, chemical, and/or physical characteristics.

The method and media of the invention can form a memory. Isomeric changes in one active medium, a photochromic material stably maintained in a volume by a polymer matrix or a vessel, permit the writing, reading, and erasing of a binary-stated information, forming thereby a three-dimensional bulk optical memory.

The method and media of the present invention can be used to make objects. Isomeric changes in another active medium, a viscous liquid monomer, cause it to change into a solid polymer. A three-dimensional solid shape is thereby generated by directed light radiation. The solid shape is not merely three-dimensional in its finished form, but can be three-dimensionally generated, replete with all internal voids and cavities if any be present, at substantially one time.

The method and media of the present invention can be used to produce a visually perceptible display. Isomeric changes in still other active media, liquids or solids, permit the generation of visually perceptible three-dimensional images. These images may be erased, or blanked, to permit successive images to be generated, forming thereby a medium and process which may be suitable, for example, for three-dimensional television.

The radiation-induced changes are characterized by two factors. First, the changes are isomeric: one molecular form changes to another molecular form having the same overall chemical formula but a different connection of its component atoms. Second, the changes are induced by plural—normally two—photon absorption. Neither of the photons is absorbed individually. Both must be absorbed simultaneously, thereby necessitating that radiation beams must overlap in space and time.

One preferred embodiment of the invention is a three-dimensional memory. The memory employs a photochromic active medium, preferably spirobenzopyran, embedded in a polymer matrix. This photochromic molecule initially in its stable spiropyran isomeric form (I) absorbs only in the ultraviolet region of the optical spectrum. Upon excitation it yields via heterolytic cleavage the merocyanine isomeric form (II). This merocyanine isomeric form, usefully stable especially at low temperatures, absorbs in the green-red region of the visible spectrum and emits red-shifted fluorescence when excited with green light.

The storage and retrieval of information into and from the three-dimensional memory store's active photochromic medium is divided into the following cycles: 1) writing, where information is recorded in the medium; 2) reading, in which the medium is probed for the existence or absence of stored information; and 3) erasing in which the recorded information is erased and the three-dimensional memory becomes available for recording new information.

To write a bit into memory, two radiation beams are selectively spatially directed into portions, or cells, of the three-dimensional volume of the active medium. Photons from each beam are individually insufficiently energetic to cause any change in the active photochromic medium. The beams are typically at a normal angle, and are more typically orthogonal, relative to one another. At least one radiation beam, and preferably both beams, are modulated, normally by being switched on and off, with the information that is desired to be stored within the three-dimensional volume of the active medium. This modulation is controlled so the beams coincide at successive portions or cells of the three-dimensional active medium.

The combined energy of one photon from each of the two beams exceeds a first threshold energy to cause the active photochromic medium to change from its first (I) to its second (II) isomeric form by process of two-photon absorption. The two photons cause a change in isomeric form of the active photochromic medium only at those selected regions where the two radiation beams intersect, i.e., are temporally and spatially coincident. In these selected regions, information can be stored, i.e., a bit can be "written", by changing the active photochromic medium to its second (II) isomeric form. Other portions of the active medium are substantially unaffected.

Reading a bit, once written, from the memory is achieved in a similar manner. Selected portions or cells, of the three-dimensional volume of active medium are again selectively illuminated with two directed radiation beams. Such radiation beams may be separate and different from the radiation beams used for writing. However, normally one beam is a beam that is also used for writing. Reading may be accomplished in parallel with (simultaneously with) writing (at different regions). In regions where the two radiation beams are temporally coincident and spatially intersect, the combined energy of photons from the two beams is at least equal to a second threshold energy, and causes, by process of two-photon absorption, cells containing the second (II) isomeric form of the active medium to fluoresce. Cells containing the first (I) isomeric form of the active medium do not fluoresce.

The second threshold energy, and the combined energies of the photons from each beam are both less than the first threshold energy. Therefore reading of a region containing the first (I) active form of the active medium also results in no isomeric change, as well as no fluorescence. Moreover, after fluorescing the second (II) isomeric form remains in the second (II) isomeric form, and is likewise unchanged by act of being read. Reading is thus non-destructive. The photons of one reading beam or the other taken individually have insufficient energy to cause any substantial change, or any fluorescence, from regions of the volume of active medium through which such beams pass.

The memory is maintained at a temperature lower than room temperature, and typically at the temperature of dry ice ($-78°$ C.), during writing, reading, and storage of data. The merocyanine isomeric form is actually stable on the order of 150 seconds at room temperature (25° C.). The isomeric molecular forms are adequately stable for months or longer at their reduced temperature, and no spontaneous thermally-induced change of isomeric form, and attendant loss of data, is experienced.

The erasing of the information stored within the active medium may be (i) in bulk by heating of the entire volume of memory, (ii) in bulk or in multiple-region sections by heating in combination with illumination by a single radiating beam, or (iii) selectively in regions by plural-photon absorption (with or without accompanying heating). Erasing of the three-dimensional volume of active medium may thusly transpire at varying degrees of granularity ranging from the entire volume to individual memory cells.

The entire volume may be erased, restoring all regions thereof to the first (I) isomeric form of the active media, simply by raising the temperature of the volume to an appropriate value. At 40° C. erasure is essentially instantaneous. This bulk erasure may be assisted by radiation (which need not be selective) which imparts energy to the process and helps to speedily "wash" or "bleach" the active medium of its second isomeric form. After erasure upon restoration of normal operating temperatures the three-dimensional volume of active medium is again suitable for storing information therein, and reading information therefrom, as described above.

Instead of applying radiation unselectively in order to assist an erasure that is primarily heat-induced, the radiation may be applied selectively. Especially if less heat is used than will erase the active medium without assistance, the selective radiation permits sections of the 3-D volume of active media to be selectively erased by illuminating these sections (only) by an intense (single) beam of radiation.

Selective, regional (cellular) erasure, may also be attempted by two-photon absorption, normally but not necessarily in combination with thermal or radiative heating. The vibration level of the active medium, or SP molecule, is identified. The active medium is then radiated by two photons suited to excite this vibrational energy mode, normally about 2.12 micron wavelength IR light for the SP molecule, while not substantially exciting the polymer matrix. Curiously, exactly the opposite approach can also be used: regionally existing the polymer matrix by two-photon absorption while no substantially exciting the medium. In each case the intent, and effect, of two-photon absorption is to energize a single cell within the 3-D volume of active medium sufficiently to induce its transition from the second to the first molecular form without perturbing adjacent cells.

Because the reading and writing operations are based on electronic transitions, nanosecond and faster response speeds for both reading and writing are obtainable. Because the changes are on a molecular scale, the information in the plane can be made very dense, on the order of $10^{15}$ bits per $cm^3$ and greater, with low cross-talk between neighboring bits.

The present invention functions equivalently if the object of the isomeric changes induced by plural, normally two, photon absorption is, instead of storing and reading binary-stated information, to pattern three-dimensional shapes, or to produce visually perceptible three-dimensional displays. In the production of three-dimensional shapes, one preferred medium is styrene, a liquid monomer. The monomer, which is held in a radiation-transparent tank in a still state, is selectively illuminated by radiation beams that are preferably of 532 nm and 355 nm. A solid polymer, polystyrene, will be formed at intersection sites. The sites are sufficiently close, and the beams sufficiently wide so as to create a monolithic connected solid object. Notably, the polymer is transparent to teach of the individual radiation beams, and can thus be formed replete with internal cavities and voids.

The styrene can be selectively colored at the same time that it is being changed to polystyrene. Photosensitive dyes, normally of the primary colors, can be selectively exposed, by process of two-photon absorption, in the styrene monomer and/or polystyrene polymer. Selective exposure of dyes is also useful to generate three-dimensional color displays.

To produce a three-dimensional display in accordance with the present invention, a fluid, nominally a polymer, medium is preferred. This medium is substantially transparent to visible light. Two-photon absorption induced at selected sites by coincident intersecting light beams, typically of visible and ultraviolet frequency induces the medium to change color or to change transmissivity (opacity). The change in transmissivity may be due to the creation of clusters that scatter light, or to changes in the index of refraction. The three-dimensional image thus formed is naturally persistent for a selectively predetermined period of time from nanoseconds to perpetuity. The image may be blanked sooner than it would normally decay, preparing the medium to be impressed with another image either by being heated or flashed with high intensity light. Such a flash may be too fast or too weak or outside visible range so as not to be visually perceptible.

These and other aspects and attributes of the present invention will become increasingly clear upon reference to the following drawings and accompanying specification.

DESCRIPTION OF THE PREFERRED EMBODIMENT

The present invention may be embodied in several different optical recording media, and in variant methods of changing the isomeric state of such media, dependent upon the purpose of the media and method. The media and method of the present invention may be employed to store information, pattern shapes, make visual displays or perform numerous other useful tasks such as, for example, creating variant gradient density optical lenses. The media and methods of the present invention generally permit the creation by selective radiation of substantially persistent three-dimensional inhomogeneity patterns in a bulk active media.

One preferred embodiment of the present invention is a 3-D memory storage device based on volume erasable optical storage in an amplitude recording medium. Reading and writing of the medium is achieved by means of two-photon process and is based in this case on the photochromic properties of a spirobenzopyran molecule embedded in a polymer matrix. The physics of the two-photon process is described by R. M Macfarlane in *J. Lumin.*, 38, 20 (1987). The spirobenzopyran molecule and its major properties are described by R. C. Bertelson in *Techniques of Chemistry: Photochromism*. vol. 3, ed. G. M. Brown, Wiley-Interscience, New York, 1971, p. 45.

This photochromic spirobenzopyran molecule initially in the spiropyran form (I) absorbs only in the ultraviolet region of the optical spectrum and upon excitation yields via heterolytic cleavage the merocyanine form (II). This merocyanine form absorbs in the green-red region of the visible spectrum and emits red shifted fluorescence when excited with green light. The excitation of the spirobenzopyran molecule to induce its change of isomeric form is illustrated in FIG. 2a. The two isomeric forms of the spirobenzopyran molecule are illustrated in FIG. 2b.

Figure 2:
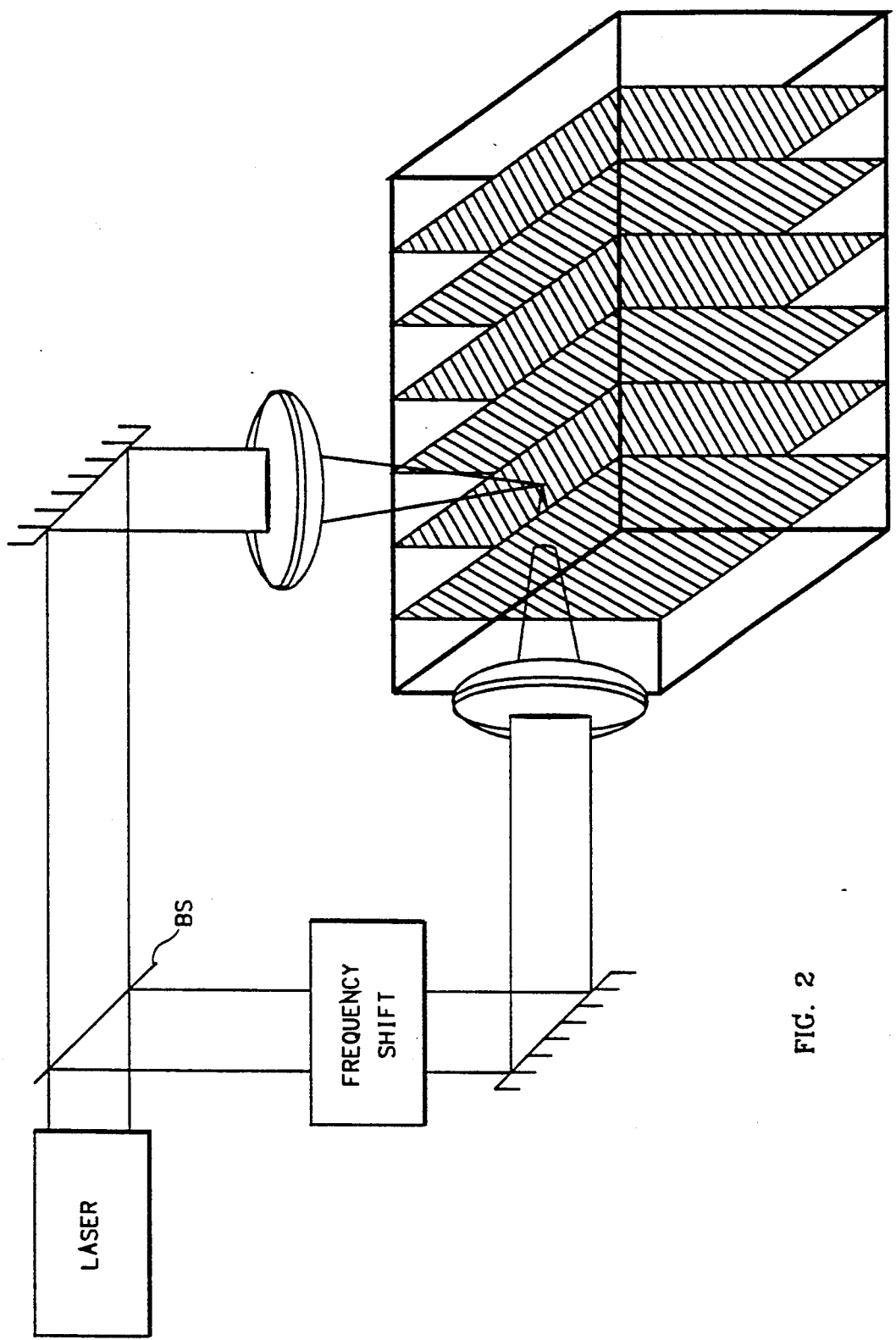
FIG. 2 is a schematic diagram of a 3-D optical memory in accordance with the present invention based on a two-photon process.

The method of the present invention for exercising the spirobenzopyran medium is based on a two-photon process where neither of the two photons can be absorbed individually; both must be absorbed simultaneously which necessitates that the two beams overlap in time and space. To achieve two-photon absorption in practice, two laser beams intersect each other at normal angles or head-on inside the 3-D medium as shown in FIG. 2. This is in contrast to a biphotonic process, as in photon gated hole burning, in which sequential excitation of the molecule to two different real, excited states is induced by the consecutive absorption of two photons. (Photon gated hole burning is described by D. A. Parthenopoulos and P. M. Rentzepis, in *Science*, TBD, 1989 (pp. TBD2).)

Since in the two-photon process absorption occurs only at the place of beam overlap it becomes evident that the two-photon process affords a true 3-D device. The major advantages of the proposed device are 1) immense information storage capacity on the order of 10 bits/cm$^3$ and higher; 2) very fast optical writing and reading speed, nanoseconds and faster; 3) small size (i.e., cm$^3$); 4) low cost; 5) absence of mechanical or moving parts; 6) minimal cross talk between adjacent bits; and 7) high reading sensitivity, and 8) parallel read and write (data) processing.

The information storage process of the present invention operates in the following cycles: 1) Writing, where information is recorded in the medium; 2) Reading, in which the medium is probed for the existence of absence of stored information; 3) Erasing, of information recorded in the medium so that the device may become available for recording new data. Information is typically stored in the form of binary code. (If a medium has three states, tertiary code can be stored.) The two states in a binary system can be obtained by exploiting chemical changes which lead to two distinct isomeric states of the particular species used as the storage medium. An example is the molecular structural changes occurring in spirobenzopyran after simultaneous absorption of two photons. Spirobenzopyran has two distinct forms: the spiropyran form and the merocyanine form which provide the two states necessary for storage of information in a binary format.

The 3-D information storage requires an active medium, a host matrix for such medium and two laser beams of the same or different wavelengths that provide the two photon excitation of the 3-D material. The 3-D memory requires the availability of two laser beams of identical or different wavelengths in order to provide the required two-photon excitation of the active, photochromic, medium. If each intersecting beam is of an identical frequency, $v_1$, then the energy difference $E_d$ between the ground and the first excited state of the original isomeric form of the medium must be equal to or less than twice, but more than once, times the energy $E_1$ of the exciting laser light. By Plank's radiation formula the energy of an atomic oscillator is equal to Plank's constant times the oscillator frequency:

$$E_1 = hv_1$$

Therefore $$hv_1 < E_d \leq 2hv_1$$

The isomeric change proceeds as:

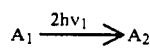

where $A_1$ is the photochromic molecule in its first isomeric form, $hv_1$ is a photon energy, and $A_2$ is a molecule in its second isomeric form. If two beams of different wavelengths are used then frequencies ($hv_1$), ($hv_2$) are selected to meet the following requirements: $E_d \leq (hv_1) + (hv_2)$, $(hv_1) \geq (hv_2)$, $E_d \leq 2(hv_2)$. In such a case the isomeric change proceeds as

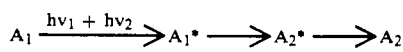

where $A_1$ is the ground state of the original isomeric form, $A_1^*$ is the excited state of the original isomeric form, $A_2^*$ is the excited state of the changed isomeric form, and $A_2$ is the ground state of the changed isomeric form.

Depending on the cycle (discussed hereinafter) the wavelength requirements are likely to be different in which case the advantage of utilizing a tunable laser source becomes apparent. Another approach to generating the required laser beams involves utilizing the harmonic generation capabilities of various nonlinear crystals as well as Raman frequencies emitted by gases, liquids or solids, in which case a number of discrete wavelengths, originating from the same fundamental wavelength, become available.

In the preferred embodiment of a 3-D memory device in accordance with the present invention the spectroscopic characteristics of spirobenzopyran described previously are employed for 3-D information storage. The "writing cycle" requires excitation in the ultraviolet region of the spectrum. For example, the "writing" of the active, spirobenzopyran, medium from its first (spiropyran) isomeric form to its second (merocyanine) isomeric must equal or exceed a first threshold energy level, equivalent to the energy of 355 nm light (which energy is, as previously stated, in the ultraviolet region of the spectrum). This required excitation is preferably provided by a 1064 nm laser light beam and an intersecting 532 nm laser light beam.

Several effects are thereby achieved. First, the 1064 nm beam alone absolutely cannot induce any change of isomeric form by two-photon absorption because two 1064 nm photons are equivalent to a 532 nm photon, which does not exceed the first threshold energy level. [Notably, absorption of two 1064 nm photons will be sufficient to cause the second isomeric form, only, to fluoresce, as will be discussed in the fourth following paragraph. This fluorescence is insufficient to cause any change in either isomeric form to the other isomeric form.]

Second, two-photon absorption of the 532 nm beam alone is possible. However, the polymer matrix is strongly absorbent at 266 nm [equivalent to two 532 nm photons]. Furthermore, two-photon absorption is proportional to the square of the power(s) of the beam(s) from which each photon is absorbed. If, for example, the 1064 nm and the 532 nm beams were to be of equal power, then the effect of each beam alone would be only one-quarter of that of the two beams combined. In accordance with the present invention, the 532 nm beam is weaker than the 1064 nm beam, thus minimizing two-photon absorption of the individual 532 nm beam without affecting the ability of this beam in conjunction with the 1064 nm beam—an ability that is proportional to the product of the power of each beam—to produce two-photon absorption. Therefore, two-photon absorption from the 532 nm beam alone is improbable, and will result in, at most, a few changed molecules out of the thousands that are present at each memory cell site. This "noise" is inconsequential to further operations, including to the "reading" discussed in the third following paragraph.

Third, the intersection of the 1064 nm and the 532 nm laser light beams produces, by two-photon absorption of a 1064 nm photon and a 532 nm photon (energy equivalent to 355 nm), a transition in the active medium from its first to its second isomeric form. The spirobenzopyran active medium, in particular, will not fluoresce (at temperatures down to at least the boiling point of liquid nitrogen, 77.36° K.) in its first isomeric form. This useful property eliminates cross-talk between adjacent molecules and cell sites wherein a molecule, once written, might fluoresce and emit light that would change the molecular isomeric form of adjacent molecules.

Fourth, if the active medium at the intersection of the two beams is already in its second isomeric form—which may be unusual if the memory is employed in an intended manner wherein only those cell sites within the active medium that are in a first isomeric form are written— then it will (i) fluoresce and (ii) remain in the second isomeric form. This fluorescence is undetected (forebearing that the memory is not being concurrently read in other locations, which is not a normal operational use), and is insufficient to cause the medium to anywheres change from either isomeric form to the other form.

The procedure for the "read" cycle is identical to that of the writing cycle, except for the wavelengths of the two laser beams. As previously stated, the second, or written, isomeric form both (i) absorbs and (ii) fluoresces in the visible. Two-photon absorption from two 1064 nm beams excites the merocyanine form of the active medium at 532 nm and induces fluorescence. If the molecules of the active medium located at a preselected spot have been "written" to the second isomeric form, then fluorescence emanates from the sample. On the other hand, if the molecules of the active medium have not been "written" to the second isomeric form, and remain in the first isomeric form, then fluorescence is not observed.

Self-absorption of the fluorescence by spirobenzopyran molecules in adjacent cells that have been "written", and which are thus in the second isomeric (merocyanine) form, does not affect the "reading" process since the major part of the fluorescence spectrum is at longer wavelengths and does not overlap the absorption spectrum. Any fluorescence absorbed by various adjacent cells will not yield a signal at the intensity level of the original excited "written" molecule and thus can be easily discriminated.

Because "reading" is based on fluorescence, a zero background process, instead of, for example, changes in the absorption cross section, the method in accordance with the present invention has the advantage of a high "reading" sensitivity. In addition, photomultipliers and CCD's with single photon sensitivities and fast response times are readily available.

Finally, the erasure cycle is performed either by (i) temperature control of the 3-D memory and/or by (ii) irradiation by infrared light. By allowing the temperature to rise to the ambient level the information is erased and the 3-D memory may be reused. By bleaching the sample with visible light (i.e., the 532 nm laser beam) the duration of the "erasure" cycle can be shortened considerably. A limitation of controlling the "erasure" cycle by temperature is that it is not possible to selectively "erase" part of the information stored in a 3-D memory unit. However, usage of light in the "erasure" cycle circumvents this difficulty.

Figure 1A:
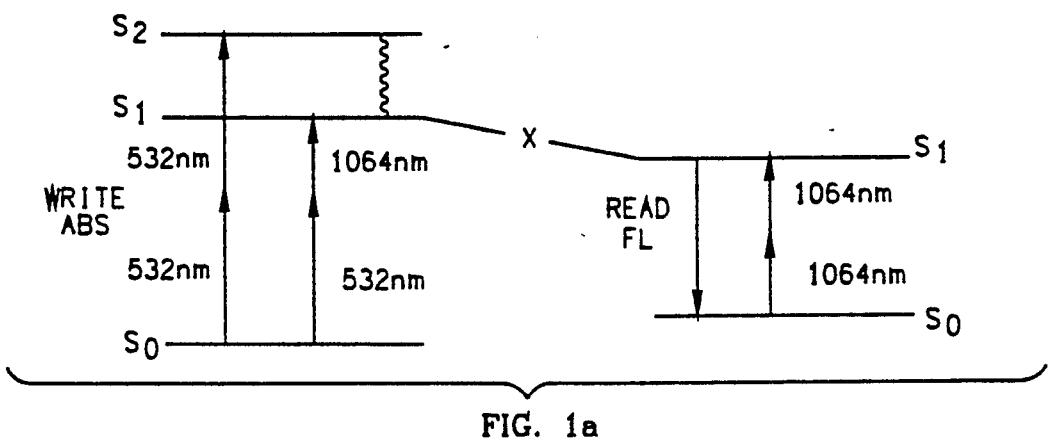
FIG. 1a is a schematic energy level diagram of the "write" and "read" forms of the preferred photochromic molecule, where "X" is an intermediate to the isomerization of the spirobenzopyrans (SP).
Figure 1B:
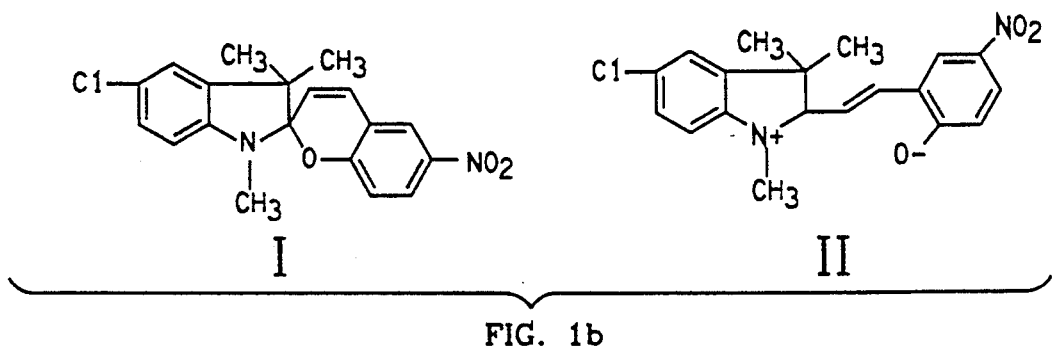
FIG. 1b is a pictorial diagram of the structures of the two forms of SP.

FIG. 1a displays an energy level diagram and FIG. 1b shows the molecular structures of the "write" and "read" forms. By translating the beams along the axes of the sample, which can be cast in a form of a cube or any other form, the required spatial resolution is achieved in the form of colored spots throughout the cube. The information can be stored in a page format with several pages superimposed in the memory device. A complication can arise from the presence of fluorescence from the excited spiroform which, if absorbed by adjacent molecules, would subsequently transform them to the written form and thus introduce cross-talk between adjacent bits. To avoid this, molecules that do not substantially fluoresce in the "write" form are preferred. Fluorescence from the "write" form of the spirobenzopyran has not been observed even at liquid nitrogen temperatures. Reference S. A. Krysanov and M. V. Alfimov, Chem. Phys. Lett., 91, 77 (1982).

The "read" cycle operates similarly to the writing cycle except that the "reading" form absorbs at longer wavelengths than the "write" form. Hence one or both laser beam wavelengths must be different than the ones used for writing. Only molecules that have previously been written will absorb this radiation and fluorescence will be emitted subsequently from this part of the memory.

On the other hand, if the molecule has not been "written" then fluorescence is not observed since the "read" two-photon wavelength cannot be absorbed as shown in FIG. 1a. Self-absorption of the fluorescence by spirobenzopyran molecules in adjacent positions that have been "written", does not affect the "reading" process because the largest part of the fluorescence is emitted at longer wavelengths and does not overlap the absorption band. Any fluorescence absorbed by any adjacent bits will yield signals which are either too weak to be detected or can be easily eliminated with electronic discriminators.

The erasure cycle is performed by increasing the temperature of the sample and/or by irradiation with infrared or visible light. By raising the temperature the molecules return to the original "write" form, the information is erased and the 3-D memory is ready for storing new data. By bleaching the sample with light (i.e., infrared) the duration of the "erasure" cycle can be shortened considerably. A limitation of controlling the "erasure" cycle by temperature is that it is not possible to selectively "erase" part of the information stored in a 3-D memory unit. However, use of light for erasing circumvents this difficulty.

The stepwise absorption of two photons is equivalent to two successive one photon excitations. However the two-photon excitation process which is employed for the 3-D memory device corresponds to the simultaneous absorption of two photons by the molecule which undergoes a transition $E_i \rightarrow E_n$ where $E_n - E_i = h\nu = h\Sigma\nu_n$ where h is Plank's constant and $\nu$ is the frequency. As shown initially by M. Goeppert-Mayer in *Ann. Phys.* (Leipzig) [5], 9, 273 (1931), the two-photon transition probability $A_{in}$, from state i to state n is proportional to three terms. The first term is the product of the intensities $I_1 I_2$, the second term represents the spectral line profile, it includes the homogeneous linewidth $\gamma_{in}$, and corresponds to a large extent to a one-photon transition of a moving molecule at a center frequency $\omega_{in}$. The third term is derived by second order perturbation theory and gives the probability for the two-photon transition. $A_{in}$ is given by Y. Kalisky and D. J. Williams, in *Macromolecules*, 17, 292 (1984). It therein gives the photon transition probability $A_{in}$ as:

matrix elements for transitions between the initial, the final and an intermediate level k. The intensity of the laser beam is equal to the square of the field, $\epsilon$, which is given by:

$$\vec{\epsilon} = (\vec{e}_1 E_1 e^{i\vec{k}_1\vec{r} - i\omega_1 t}) + C.C.$$

where in addition to the previously defined symbols, $E_1$ are the field amplitudes, $\vec{r}$ is the position vector, and c.c. is the complex conjugate.

The characteristics of two-photon transitions are as follows: States of the same parity as the ground state can be accessed while one-photon transitions to these states are forbidden. The incident beams may have greatly separated energies, i.e., UV and IR. It is possible to eliminate momentum transfer between the incident beam and the molecule. It is possible to excite by two-photon processes states that cannot be accessed with one-photon processes and obtain high resolution spectra. However, for large molecules several vibronic levels are accessed simultaneously owing to the finite laser linewidth so that the parity requirement is relaxed.

In the preferred embodiment of a memory in accordance with the present invention a passively/actively modelocked $Nd^{3+}$/YAG laser such as, typically, type Quantel YG501-20 emits 1064 nm, 20 ps pulses at a repetition rate of 20 Hz. The 1064 nm fundamental wavelength, the 5 32 nm second harmonic, the 355 nm third harmonic and the 266 nm fourth harmonic are used. The fundamental beam is circularly polarized, whereas the higher harmonics are linearly polarized.

Absorption spectra may be recorded on an absorption spectrophotometer, such as type Cary 219. The one-photon and two-photon induced fluorescence spectra are dispersed using a 0.25 m monochromator, and are detected by an intensified diode array coupled to a microcomputer. The time-resolved spectra are obtained with a streak camera coupled to an intensified diode array which is connected to a microcomputer. When needed a 150 W Xenon lamp provides steady state UV irradiation of the sample.

The molecule 5'-chloro-6-nitro-1',3',3'-trimethyl-spiro-[2H-1-benzopyran-2,2'-indoline], SP, (Chroma Chemicals) was purified by recrystallization from methanol and benzene. The polymer hosts polystyrene, PSt, (Aldrich), polymethylmethacrylate, PMMA, (Aldrich), polyethyleneglycol, PEtG, (Sigma), as well as the solvents methanol (HPLC grade, Fisher), chloroform (HPLC grade, Fisher), dichloroethane (HPLC grade, Aldrich) were used without further purification.

Thin polymer films (100 μm) containing 1% SP by weight were prepared on a glass slide by solvent casting from a dichloroethane solution which contained 30% PSt by weight, or from a chloroform solution containing either 30% PMMA by weight, or 30% PEtG by weight. All films were placed in a vacuum for several hours to ascertain complete evaporation of the solvent.

Figure 3:
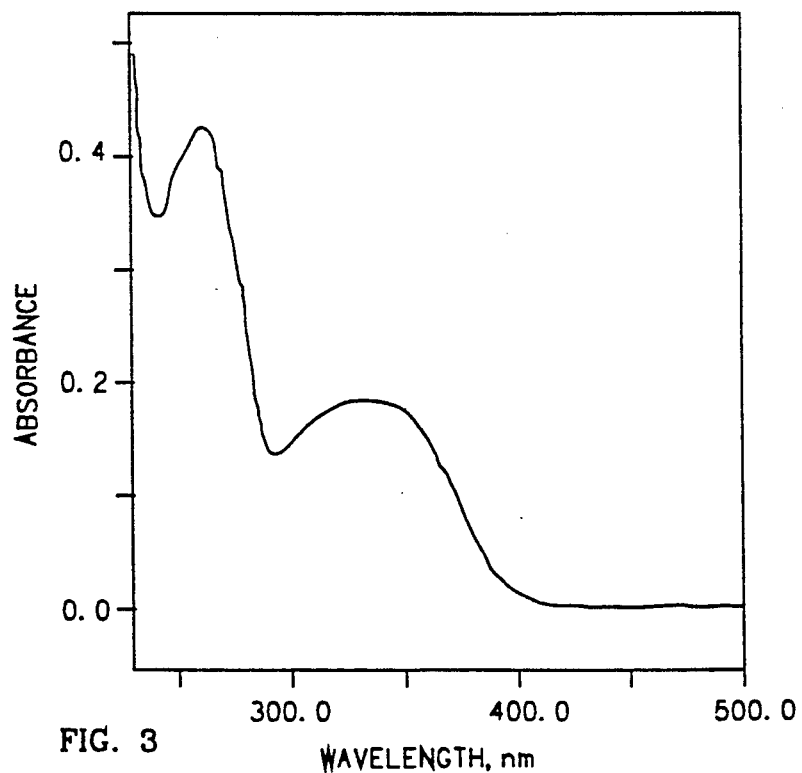
FIG. 3 is a graph showing room temperature UV absorption spectrum of SP in a 30% PEtG/CHCl$_3$ solution before irradiation wherein (i) absorption is not observed above 400 nm, (ii) SP weight is 1% relative to the weight of the polymer, and (iii) path length = 2 mm.

FIG. 3 shows the UV absorption spectrum of SP in a polyethylene glycol/chloroform solution. The salient $$A_{in} \propto I_1 I_2 \frac{\gamma_{in}}{[\omega_{in} - \omega_1 - \omega_2 - \vec{v}(\vec{k}_1 + \vec{k}_2)]^2 + \left(\frac{\gamma_{in}}{2}\right)^2} \left| \sum_k \frac{\vec{R}_{ik}\vec{e}_1 \vec{R}_{kn}\vec{e}_2}{(\omega_{ki} - \omega_1 - \vec{k}_1\vec{v})} + \frac{\vec{R}_{ik}\vec{e}_2 \vec{R}_{kn}\vec{e}_1}{(\omega_{ki} - \omega_2 - \vec{k}_2\vec{v})} \right|^2$$

where $\omega_1$, $\omega_2$ are the angular frequencies of beams 1 and 2, $\vec{k}_1$, $\vec{k}_2$ are the wave vectors $\vec{e}_1$, $\vec{e}_2$ are the polarization vectors, $\vec{v}$ is the molecular velocity and $\vec{R}_{ik}$, $\vec{R}_{kn}$ are the features of the spectrum are the two bands, one centered at approximately 325 nm and the other at approximately 260 nm. It is observed that the molecule shows considerable absorption at both 355 nm and 266 nm albeit the first is approximately 2-3 times weaker. Thus SP is appropriate for two photon absorption studies by a combination of the fundamental and the higher harmonics of the $Nd^{3+}$/YAG laser.

Figure 4:
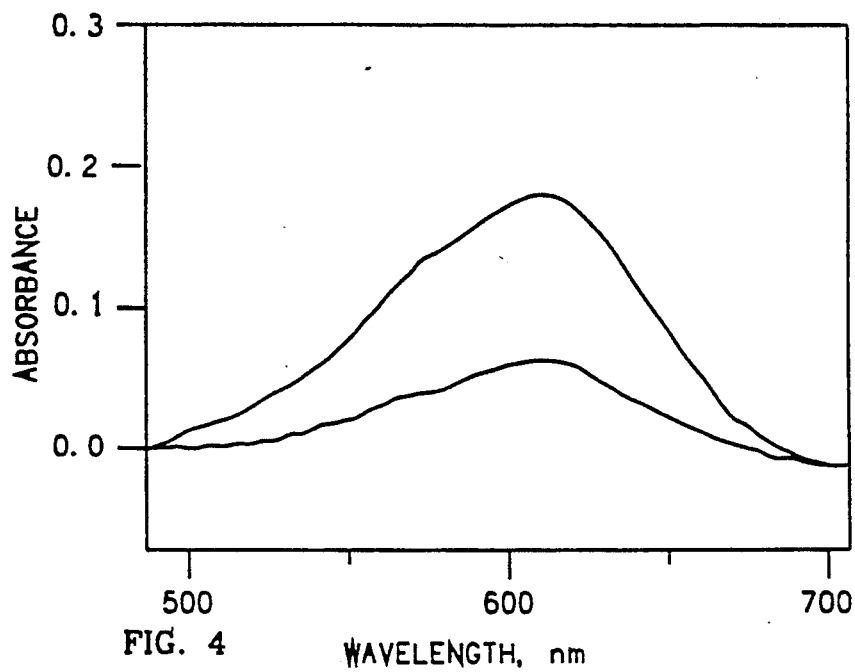
FIG. 4 is a graph showing room temperature visible absorption spectrum of 1% SP in a PSt film both (i) after irradiation for 5 sec with 355 nm, pulse fluence 4 mJ/cm$^2$, and (ii) after irradiation for 60 sec with 532 nm and 1064 nm, total pulse fluence 20 mJ/cm$^2$, wherein in both cases beam d = 1 cm.

FIG. 4 shows the room temperature visible absorption spectrum of SP in PSt. After irradiation in the UV a new absorption band in the red region of the visible spectrum is observed. In FIG. 4 the absorption spectrum of the two-photon excited SP is also shown which is identical, as expected, to the one photon spectrum. The two-photon photochromism is induced by spatially and temporally overlapping the 532 nm beam with the 1064 nm beam of the $Nd^{3+}$/YAG laser. The sum of the energies of the two photons equals the energy of the transition which occurs at 355 nm. When the film is irradiated with only the 532 nm beam or the 1064 nm beam photochromism is not observed.

It is obvious that the two-photon method puts a stringent requirement on the simultaneous arrival of the two pulses since the intermediate virtual state has essentially no lifetime. Reference P. M. Rentzepis, Chem. Phys. Lett., 2, 117 (1968). The process is in effect dependent upon the square of the laser peak power, hence short pulses (i.e., picosecond) are preferable owing to their inherent high peak power. Because the PSt matrix shows a strong absorption at 266 nm, photochromism induced by two 532 nm PSt matrix shows a strong absorption at 266 nm, the fact that photochromism induced by two 532 nm photons from SP in PSt is not observed is most probably due to quenching.

Figure 5:
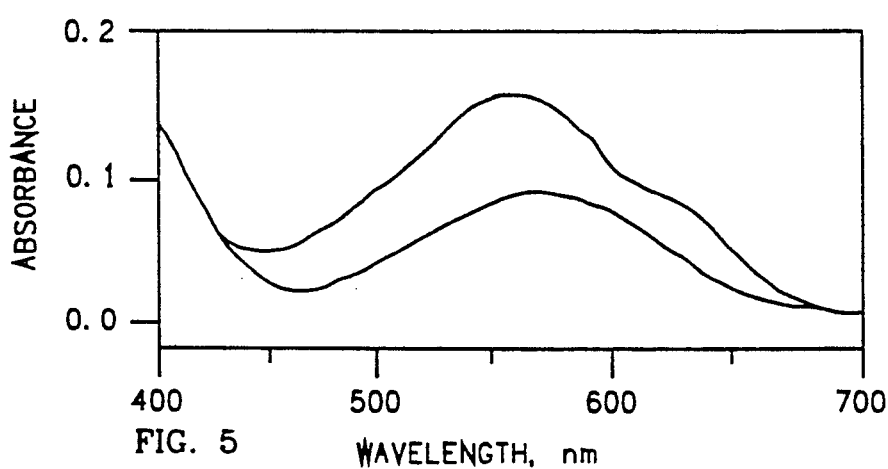
FIG. 5 is a graph showing the absorption spectrum of 1% SP in a PEtG film after being placed in dry ice and allowed subsequently to warm up to room temperature both (i) after excitation for 5 sec with 266 nm light with a pulse fluence equalling 2 mJ/cm$^2$ and (ii) after excitation for 60 sec with 532 nm light with a pulse fluence equalling 5 mJ/cm$^2$, both with a beam d = 1 cm.

FIG. 5 shows the absorption spectra of SP in PEtG when isomerized via one-photon and two-photon excitation. These films were placed in dry ice and a change in color was observed from violet to blue. This change in color results from the shoulder of the absorption band between 600 and 650 nm. The films were allowed to warm up at room temperature for a few minutes before the absorption spectra, shown in FIG. 5, were taken. The absorption shoulder at approximately 625 nm persists for several minutes at room temperature, and for several months or longer at $-78°$ C.

The appearance of different colored forms at different temperatures has been attributed to equilibrium between various colored species. Reference R. C. Bertelson, in *Techniques of Chemistry: Photochromism*. vol. 3, ed G. M. Brown, Wiley-Interscience, New York, 1971, p. 45. In the polymer matrix aggregation is favored; in addition at low temperatures aggregation is enhanced. The spectral position of the shoulder is very similar to the absorption maximum of the merocyanine form of SP in PSt. In the less polar PSt matrix aggregation is expected to be favored, therefore this new absorption shoulder can be attributed to aggregate formation. In PMMA the absorption of the merocyanine form is also blue shifted relative to PSt. However when the PMMA films are placed in dry ie ($-78°$ C.), a color change is not observed. It is possible that the more polar PMMA prevents aggregation from occurring even at dry ice temperatures.

FIG. 5 also shows the absorption spectrum of a PEtG film of SP which has been excited by two photons of 532 nm. Since the PEtG host polymer does not absorb at 266 nm and the absorption cross section of SP at 266 nm is higher than the absorption cross section at 355 nm, the two-photon absorption was readily observed in this system. This allows a decrease in the required beam intensity, which lowers the possibility of photochemical decomposition of the sample. The absorption spectrum of the merocyanine form of SP is blue shifted in the more polar PEtG matrix relative to the absorption spectrum in PSt. This indicates a n→$\pi^*$ transition to the first excited state and a larger ground state dipole moment.

The fluorescence of the merocyanine form of the spirobenzopyrans has received less attention than the parent form, although merocyanine fluorescence has also been observed previously. Reference P. S. Becker and J. K. Roy, *J. Phys. Chem.*, 69, 1435 (1965); A.V. Shablya, K. B. Demidov and Yu. N. Polyakov, *Opt. Spectry*, 20, 412 (1966); and K. Horie et al., *Chem. Phys. Lett.*, 119, 199 (1985).

Figure 6:
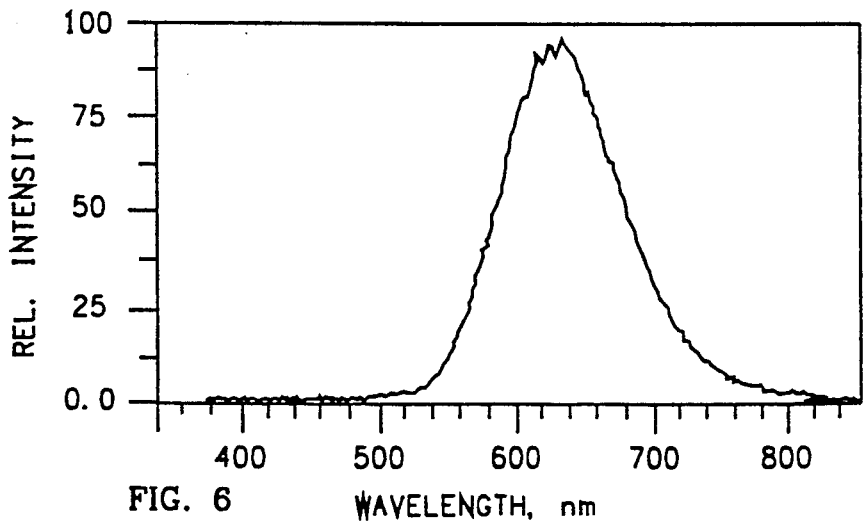
FIG. 6 is a graph showing room temperature fluorescence spectrum of the merocyanine form of 1% SP in PMMA with an excitation wavelength of 532 nm, a pulse fluence of 0.1 mJ/cm$^2$, and a beam d = 2 mm.
Figure 7:
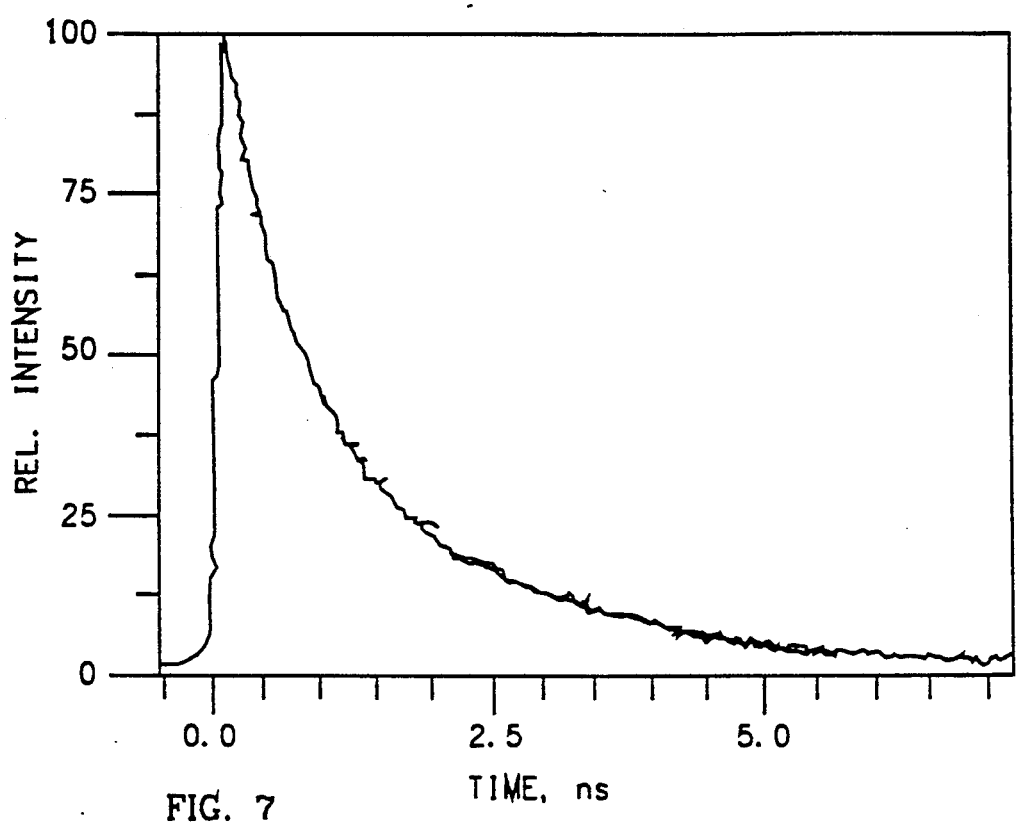
FIG. 7 is a graph showing the decay of the merocyanine fluorescence of 1% SP in EPtG, monitored at 600 nm where excitation equals 532 nm, pulse fluence equals 0.1 mJ/cm$^2$, and beam d = 2 mm.

The one-photon induced fluorescence spectrum of the merocyanine form of SP in PMMA is shown in FIG. 6. The fluorescence of SP in PEtG exhibits at least a biexponential decay as shown in FIG. 7. The lifetimes of the merocyanine fluorescence of SP in solution and in various matrices are summarized in the following Table 2 where it is shown also that the fluorescence exhibits at least biexponential decays.

TABLE 2

Lifetimes of SP Fluoroescence in Solution and in Polymer Matrices Monitored at 600 nm.
Lifetime uncertainty is $\pm 10\%$

| Solvent/ Matrix | Concentration or % weight | $t_1$, amplitude (ps) | $t_2$, amplitude (ps) |
| --- | --- | --- | --- |
| Methanol | $2.9 \times 10^{-5}$ M | 40, 0.75 | 300, 0.25 |
| PMMA | 1% | 1300, 0.60 | 3300, 0.40 |
| PEtG | 1% | 600, 0.62 | 2500, 0.38 |
| PSt | 1% | 1800, 0.60 | 4000, 0.40 |

This biexponential decay implies that the merocyanine molecules in the polymer films and in solution exist in various forms. The presence of various aggregates in addition to the monomer is very probable considering the high concentration of SP in the films. The decay of the merocyanine form to the original spiropyran form has been shown to be concentration dependent suggesting the existence of various aggregate forms. Reference H. Eckhardt, A. Bose and V. A. Krongauz, *Polymer*, 28, 1959 (1987). The fluorescence lifetime is shown to be shorter in solution than in the polymer matrices. This may be attributed to viscosity effects in the rigid polymer matrices, in addition to the influence of the free volume in each matrix. Further, the polar properties of the matrices used influence the degree of aggregation so that analysis of the observed biexponential decays based on simple model is not feasible. Lifetime values of a different spirobenzopyran molecule have been reported by Horie et al. (cited previously). However these authors report a single lifetime. Since the molecule studies and the concentrations are different, such discrepancies may be expected.

Figure 8:
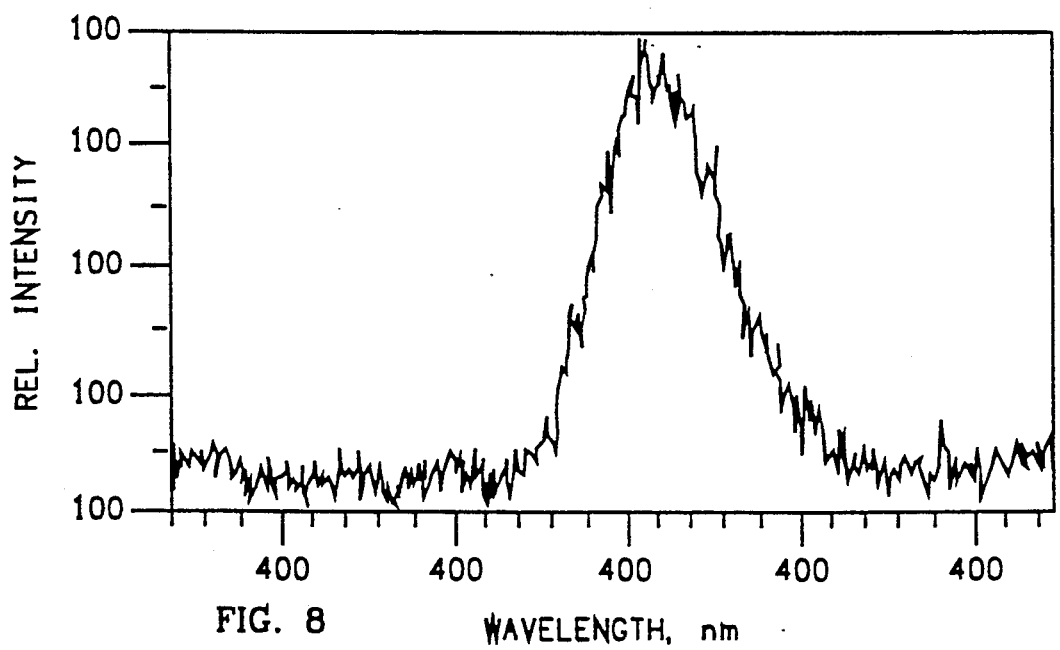
FIG. 8 is a graph showing room temperature two-photon induced fluorescence spectra of the colored merocyanine form of 1% SP in a) PMMA and b) PEtG where the excitation wavelength equals 1064 nm, the pulse fluence equals 1.5 mJ/cm$^2$, and the beam d = 2 mm.

The spectra of the two-photon induced fluorescence of the merocyanine form of SP in PMMA and in PEtG films are shown in FIG. 8. The two-photon induced fluorescence spectrum was found to be identical to the one photon spectrum. The two-photon fluorescence was induced by two photons of 1064 nm which corresponds to a transition at 532 nm. The absorption spectrum of the merocyanine form of SP in PMMA shows an absorbance at 532 nm, which is approximately 70% of the absorption maximum located at approximately 560 nm. Since the absorption spectrum of the merocyanine form of SP in PSt is red shifted relative to the absorption spectrum in PMMA (discussed hereinafter)

the two-photon induced fluorescence of the merocyanine form of SP in PSt is not observed owing to minimal absorbance at 532 nm. The energy dependence of the two-photon induced fluorescence intensity of SP in PMMA is presented in FIG. 9. As expected for a two-photon process, a square excitation intensity dependence of the two-photon induced fluorescence intensity is observed. The maximum energy of the beam was kept below the level where stimulated Raman processes and saturation effects occur.

Figure 10:
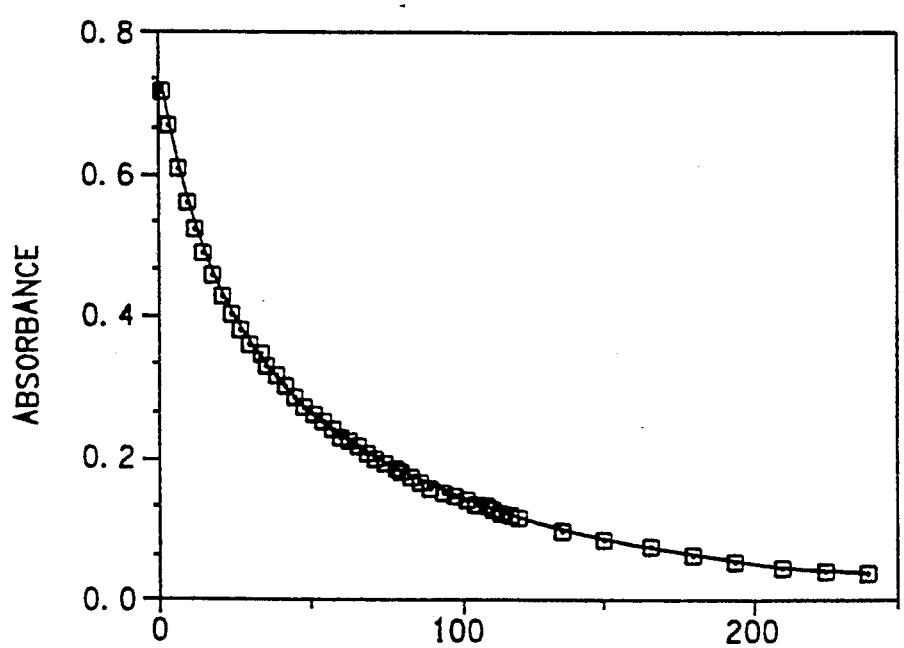
FIG. 10 is a graph of the decay of the colored merocyanine form of 1% SP in PMMA at room temperature (24° C.).

The decay (fading) of the ground state colored merocyanine form (written form) of SP in PMMA at room temperature is displayed in FIG. 10. A biexponential decay of this colored form is observed with $k_1=0.00173$ $sec^{-1}$ and $k_2=0.00024$ $sec^{-1}$ and amplitudes 0.2365 for $k_1$ and 0.489 for $k_2$. This biexponential decay is in reasonable agreement with results presented by Eckhardt, et al. (previously cited). In PEtG and in PSt however the decay constants are one to two orders of magnitude larger than in PMMA therefore the colored form fades much faster. Several studies on the fading rates of the colored merocyanine form of spirobenzopyrans indicate that the fading rates are dependent on the distribution of the free volume in the polymer matrices. Reference G. Smets, *Adv. Polym. Sci.*, 50, 17 (1983). In addition, the fading rates are strongly concentration dependent, owing to the presence of different aggregates. The previously cited reference of Eckhardt, et al., may again be consulted. Although the concentration of SP in the various matrices was kept the same, differences in the fading rates still persist owing to the varying polarity of the matrices. Several films of SP in PMMA kept at $-78°$ C. maintained the violet color of the merocyanine (written) form of SP for several weeks.

The data presented in the figures and discussed above show the manner of reading and writing of a 3-D optical memory device based on two-photon processes. An obvious advantage of this new memory, in addition to the 3-D nature of the device, is the very fast random access of the information. Since picosecond (or nanosecond) optical pulses and nanosecond signals are involved, the "write" and "read" cycle can be completed easily on a nanosecond time scale allowing for GHz clock rates. The process is essentially limited by the rate of the process that transforms the molecule from one form to the other. In the case of spirobenzopyrans it has been shown that the isomerization occurs within 10 ps. Reference S. A. Krysanov and M. V. Alfimov, *Chem. Phys. Lett.* 91, 77 (1982). The method of the present invention also permits parallel bit addressing which should result in a considerable increase of random access rates. For parallel addressing the lenses may be replaced by a holographic grating or other devices providing parallel write-read-erase capability. Crosstalk and scattering of the beams—which are common in holographic memories—do not present a problem in this case because the volume accessed by the overlapping beams is well defined and is, in principle, diffraction limited. In the particular case of spirobenzopyrans, the wavelengths that are required in the various cycles are easily available from a $Nd^{3+}$:YAG laser.

Fatigue, which for a photochromic molecule is defined as the gradual loss of the ability to change color after repeated colorization and decolorization cycles is a very important drawback of any device. Since these cycles correspond to the "write" and "erasure" cycles of the 3-D memory device, fatigue places a limit on the maximum number of "write" and "erasure" cycles that can be performed on a single 3-D memory unit. However a judicious choice of the chemical medium permits a very large number of cycles to be sustained. In addition, if the medium is kept at low temperatures then side reactions are suppressed and fatigue may be minimized to a large extent. Furthermore, at low temperatures the persistence of the written form is extended considerably.

Various possibilities for the choice of the chemical medium exist. The molecule can be polymerized as a copolymer instead of being embedded in a polymer matrix. Reference I. Cabrera and V. Krongauz, *Macromolecules*, 20, 2713 (1987); and Y. Kalisky and D. J. Williams, *Macromolecules*, 17, 292 (1984). Molecules with a high isomerization quantum yield and as high as possible two-photon absorption cross sections are very desirable. The "written" form should be stable at room temperature or at temperatures as low as liquid nitrogen temperature for the 3-D memory material to be of practical interest, and should also absorb at wavelengths that are easily produced by currently available lasers. In addition, at least one of the two isomers should fluoresce enabling one to easily probe the state of the molecule, even though reading via absorption is also possible. A number of systems which span a wide range of photochemical mechanisms are promising candidates for an optical 3-D information storage medium. These include F-centers, ions, radicals, clusters and other media that undergo light-induced changes.

Figure 11:
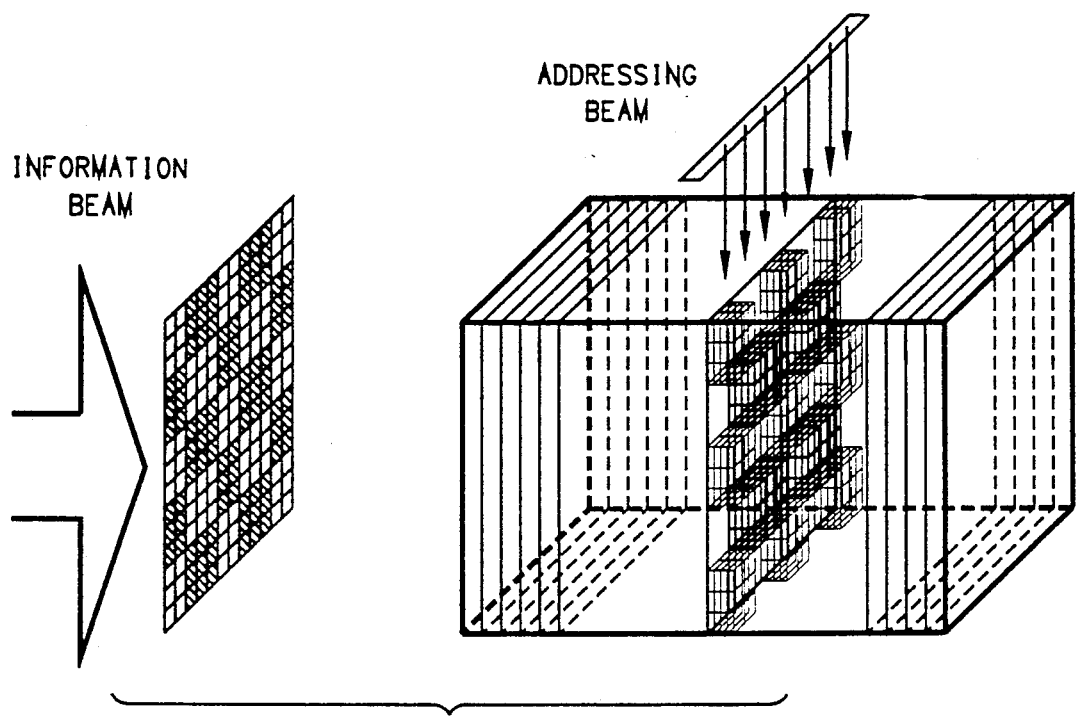
FIG. 11 is another schematic diagram of the two-photon addressing of a volume storage material.
Figure 12:
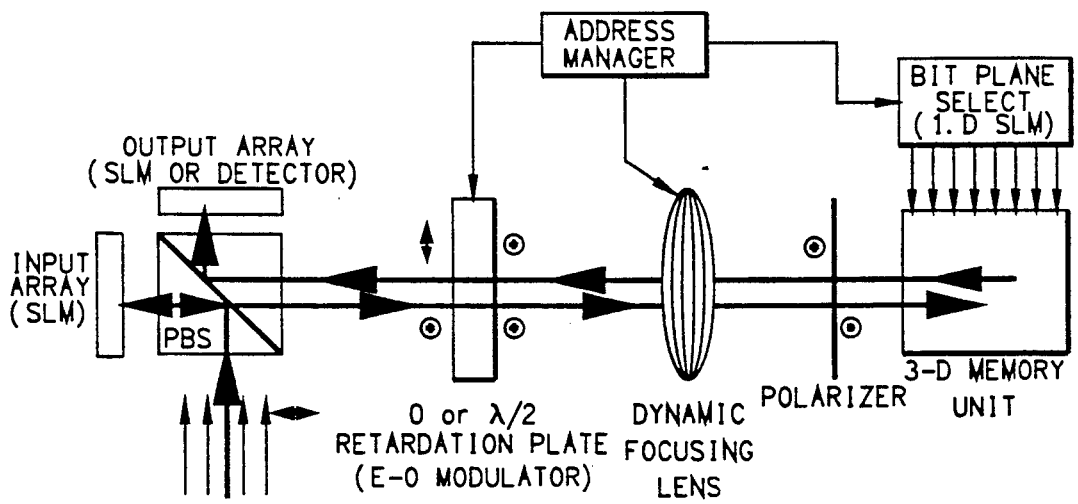
FIG. 12 is a schematic diagram of a two-photon volume memory system using the two-photon volume storage material in accordance wit the present invention.

A further representation of the two-photon addressing of a volume, or region, of storage medium within a bulk three-dimensional matrix, similar to the representation of FIG. 2, is shown in FIG. 11. The use of the two-photon effect in the present invention is simply to change a molecule to a different isomeric form due to the simultaneous absorption of two photons of different energies. The first photon excites the molecule to a virtual state, while the second photon further excites the molecule to a final, changed, isomeric form. The two photon energy requirement allows the memory unit to have a precise addressing capability as is shown in FIG. 11. Information is stored in a binary format. The two states in a binary system can be obtained by exploiting chemical changes which lead to two distinct molecular forms of the particular medium in use. In the case of the photochromic molecules the two distinct structural forms of the molecule provide the two states necessary for storage and retrieval of information in a binary format.

Figure 9:
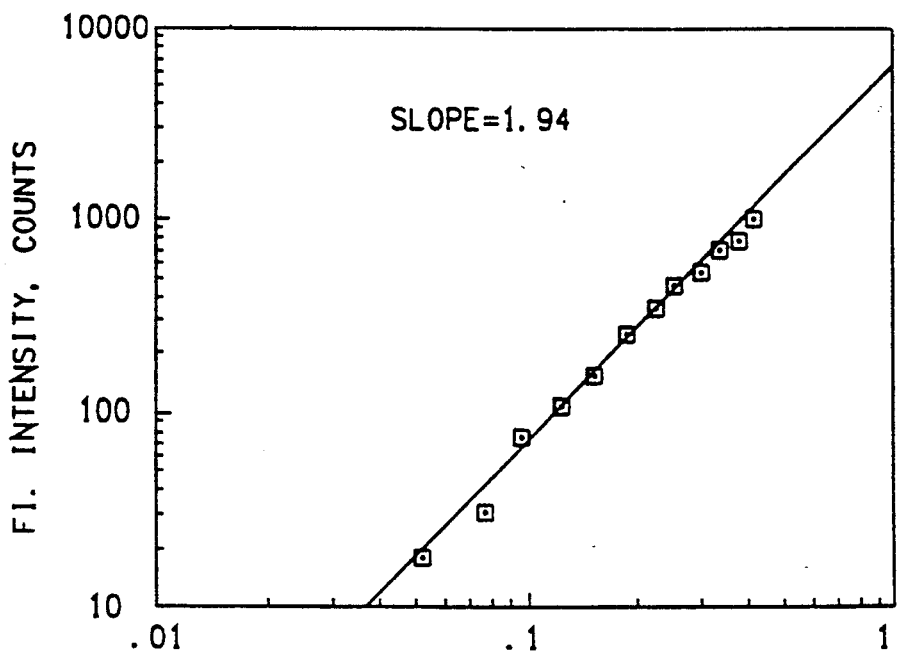
FIG. 9 is a log-log plot of the fluorescence intensity versus the excitation pulse energy of two-photon induced fluorescence; a slope of 2 within experimental error is observed (correlation equal to 0.992).

A two-photon volume memory system using a bulk three-dimensional memory store in accordance with the present invention is illustrated in FIG. 9. This system is composed of many addressable layers of the two-photon material, each layer being able to store a bit-plane, or a complete plane in one dimension. The connection between this memory system and the computer that accesses the memory is via the Input and Output Spatial Light Modulators (SLM) and the Address Manager which is a microprocessor. Since the information is carried optically between the Input/Output Arrays to a single layer of the Memory Unit, a Dynamic Focusing Lens (DFL) must be used to provide the proper imaging between the two planes.

Both the WRITE and READ cycles have been drawn to show the flow of information into and out of the system. For the WRITE cycle, the write beam enters the polarizing beam splitter (PBS) and is deflected toward the input SLM. This SLM modulates the polarization of the optical field in direct correspondence with the desired information bit-plane. Upon reflection back through the PBS, only the modulated parts of the beam are allowed to pass straight through. The information is then imaged into the selected memory layer using the Dynamic Focusing Lens (DFL). The Address Manager communicates with the host computer and controls the DFL and the Bit Plane Select beam so that information is stored at the correct location.

For the READ cycle, the Bit Plane Select beam stimulates a particular bit-plane of the Memory. This causes light to be generated at each of the written bits. This light is then polarized by P2 and focussed onto the Output SLM using the DFL. In order to steer the information through the PBS and onto the output plane, the polarization must be rotated by 90. This is achieved with the activation of the electro-optic λ/2 retardation plate during each READ operation. The Address Manager controls all of the essential components (DFL, Bit Plane Select, λ/2 retardation plate) to guarantee that the information is imaged onto the output detector array. This system can easily be expanded to allow for partial erasability.

The proof of the operability of the three-dimensional memory, and of three-dimensional medium for other purposes, in accordance with the present invention need not involve holograms. A three-dimensional memory as simple as $2 \times 2 \times 2$ cells may be written, read, and erased at a leisurely pace upon an optical bench. A laboratory laser of the Nd-YAG type, such as the Spectrophysics Model 300 YAG laser, is preferred. The laser beams can also be directed to selected cell sites by mechanical means.

Generally, however, the three-dimensional optical memory in accordance with the present invention is addressable at a vast multitude of cell sites, preferably by holograms. For example, two axis illumination through two 1000 line holograms addresses at one time 1000 cells, making the addressable word length 1000 bits. Holograms are available at about $10^5$ lines per centimeter. A typical three-dimensional memory would be several tens of centimeters in each of three axis, and thus would write individual words on the order of $10^6$ bits/word. It is possible to address the memory a bit-plane at a time instead of a word at a time. Instead of illuminating through one hologram in each axis, an array of $2 \times 2$, or $10 \times 10$, or $1000 \times 1000$ would be used. Such a voluminous fast data storage rate, although not excessive in relation to the overall storage capacity of the three-dimensional optical memory, is generally not required by the digital electronics to which a memory system commonly interfaces. Storage of entire planar areas of the three-dimensional memory at one time could, for example, permit the real-time storage of digitalized video information.

The performance of a three-dimensional optical memory constructed in accordance with the present invention may be analyzed as follows. A reasonable size for the bulk memory is one hundred cubic centimeters $((1 \times 10^{-1}m)^3)$. The intersecting light beams may be at the diameter of diffraction limited spots. Generally $10^5$ discretely addressable locations per centimeter in each dimension are presented. Memory capacity is thus $(10^5)^3$, or $10^{15}$ bits ($10^{12}$ bytes) per cubic centimeter. The intersecting light beams are turned on at least as long as light takes to propagate through ten centimeters, or about 330 picoseconds ($330 \times 10^{-9}$ seconds) The frequency of writing or reading one word is thus not greater than 1/30 gigahertz. No problem is presented in the required laser light power, which is in microjoules. Similarly, the preferred CW YAG laser can be switched on and off at femtosecond ($10^-$sec) intervals, and can perform continuously at picosecond duration cycles. Lastly, the photodetectors are also fast and sensitive, operating reliably on a few photons at gigahertz rates.

In accordance with the preceding discussion, one preferred embodiment of the invention will be understood to be based in a 3-D write, read, and erase optical memory. The memory based on the photochromic properties of molecules. It operates by a two-photon process. Two-photon spectroscopy and kinetic analysis show that the read and write cycles are indeed achieved by two-photon processes.

The advantages of the 3-D memory in accordance with the present invention are the immense information storage capacity, erasability, very fast random access of the information, compact size, and the absence of any moving mechanisms. This 3-D optical memory in accordance with the present invention opens a new avenue in the search for more efficient information storage devices which will enhance the uses and capabilities of future high performance computers.

Accordingly, the scope of the present invention should be determined by the following claims, only, and not solely in terms of that preferred embodiment within which the invention has been taught.

What is claimed is:

1. A method of producing a three-dimensional inhomogeneity pattern in a volume of active medium in response to directed electromagnetic radiation, the method comprising:
   first-radiating with a first beam of electromagnetic radiation at least a selected portion of an active three-dimensional medium, the medium (i) having at least two isomeric molecular forms and (ii) responsive to energy level changes stimulated by electromagnetic radiation to change from one of its isomeric molecular forms to another of its isomeric molecular forms, in order to excite this selected portion of the medium to a virtual state; and
   second-radiating with at least one second beam of electromagnetic radiation at least a part of the selected portion of the medium while such selected portion is within its virtual state so as to change this part of the selected portion of the medium from the one isomeric molecular form to the other isomeric molecular form by process of plural-photon absorption.

2. The method according to claim 1 including:
   containing the active medium in a matrix of a material that is substantially transparent to the first and to the at least one second beam of electromagnetic radiation and that is capable of maintaining a substantially stable shape.

3. The method according to claim 1 including:
   containing the active medium in a vessel substantially transparent to the first and to the at least one second beam of electromagnetic radiation and defining the three-dimensional volume.

4. The method according to claim 1 wherein:
   the first-radiating and the second-radiating of the selected portion of the active medium with two directed beams of electromagnetic radiation selected portion from the one isomeric molecular form to is simultaneous.

5. The method according to claim 4 wherein:
the active medium changes from its first to its second isomeric molecular form in response to electromagnetic energy equal to or greater than a first threshold energy; and and wherein the first-radiating comprises:
radiating the selected portion of the active medium with a first directed beam of electromagnetic radiation of a first energy, less than the first threshold energy; and wherein the second-radiating comprises:
simultaneously radiating the selected portion of the active medium with a second directed beam of electromagnetic radiation of a second energy less than the first threshold energy
wherein the combined energies of the first and second directed beams is least equal to the first threshold energy;
wherein the radiating and simultaneous radiating change the selected portion of the active medium from the first to the second isomeric molecular form by process of two-photon absorption.

6. The method according to claim 5 wherein the active medium fluoresces in response to electromagnetic energy at least equal to a second threshold energy which second threshold energy is less than the first threshold energy and wherein the method further comprises:
third-radiating the selected portion of the active medium with a third directed beam of electro-magnetic radiation of a third energy, less than the second threshold energy, so as to excite this selected portion to a virtual state; and
fourth-radiating the selected portions of the active medium with a fourth directed beam of electromagnetic radiation of a fourth energy less than the second threshold energy, while such selected portions are within the virtual state;
wherein the combined energies of the third- and fourth directed beams is at least equal to the second threshold energy and less than the first threshold energy; and
wherein the third-radiating and the fourth-radiating cause by process of two-photon absorption the selected portion of the active medium to fluoresce.

7. The method according to claim 5 including:
elevating the temperature of the active medium to a level sufficient so as to impart energy at least equal to the second threshold energy to the active medium therein to change at least the selected portion thereof from the second isomeric molecular form to the first isomeric molecular form.

8. The method according to claim 7 including:
elevating the temperature of the medium to a higher level than during the first-radiating and the second-radiating, but which higher level is insufficient to impart energy at least equal to the second threshold energy to the medium; and
radiating the selected portion of the active medium with a beam of electromagnetic radiation while the temperature of the active medium is elevated to the higher level so as to by this radiating facilitate the further elevation of temperature the medium to a level sufficient so as to impart at least the second threshold energy to the medium, therein to change at least the selected portion from the second isomeric molecular form to the first isomeric molecular form.

9. A memory apparatus for storing binary information in a three-dimensional volume of an active medium sensitive to radiation of an energy at least equal to a first threshold energy level so as to change from a first to a second isomeric form, the memory apparatus comprising:
means for directing radiation of a first energy level, less than the first threshold energy level, to a selected portion of the active medium in order to excite this selected portion of the medium to a virtual state; and
means for directing radiation of a second energy level, also less than the first threshold energy level, to selected parts of the selected portion of the active medium while this selected portion of the medium is in its virtual state;
wherein the combined energies of the first energy level radiation and the second energy level radiation are at least equal to the first threshold energy level;
wherein the means for directing radiation of the first energy level and the means for directing radiation of the second energy level jointly cause the selected parts of the selected portion to change from their first to their second isomeric form by process of plural-photon absorption;
wherein the selected, changed, parts of the selected portion of the active medium and the remaining, unchanged, parts of this same selected portion of the active medium constitute binary-stated information.

10. The apparatus according to claim 9 further comprising:
means for reading the binary-stated information from the selected portion of the active medium.

11. The apparatus according to claim 9 wherein the active medium in its second isomeric form fluoresces in response to radiation of an energy at least equal to a second threshold energy level which second threshold energy level is less than the first threshold energy level; and wherein the means for reading comprises:
means for directing radiation of a third energy level, less than the second threshold energy level, to the selected portion of the active medium; and
means for simultaneously directing radiation of a fourth energy level, less than the second threshold energy level, to the selected portion of the active medium;
wherein the combined energies of the third energy level radiation and the fourth energy level radiation are at least equal to the second threshold energy level;
wherein the means for direction radiation of the third energy level and the means for simultaneously directing radiation of the fourth energy level are jointly sufficient so as to jointly cause the selected portion in its second isomeric form to fluoresce.

12. The apparatus according to claim 11 further comprising:
means for detecting fluorescence from the selected portion.

13. The apparatus according to claim 12 wherein the active medium in its first isomeric form has a threshold energy level of fluorescence that is at least equal to the second threshold energy level.

14. The memory apparatus according to claim 12 wherein the active medium in both of its isomeric forms has a threshold energy level of fluorescence that is greater than the second threshold energy level.

15. The apparatus according to claim 12
   wherein the active medium does not change from either of the isomeric forms to the other of the isomeric forms in response to radiation of an energy less than the first threshold energy level;
   wherein the combined energies of the third energy level radiation and the fourth energy level radiation are at least equal to the second threshold energy level, and are less than the first threshold energy level;
   wherein the means for directing radiation of the third energy level and the means for simultaneously directing radiation of the fourth energy level jointly cause the selected portion in its second isomeric form to fluoresce without changing this second isomeric form back to the first isomeric form.

16. The memory apparatus according to claim 15 wherein the active medium is sensitive to radiation of an energy level at least equal to a third threshold energy level, greater than the first threshold energy level, for changing to the first isomeric form the memory apparatus further comprising:
   means for providing a fifth energy level, of a magnitude at least equal to the third threshold energy level, to at least the selected portion of the active medium to erase at least this portion of the memory by changing it to the first isomeric form.

17. The apparatus according to claim 16 wherein the providing means comprises:
   means for elevating the temperature of the active medium so as to provide the fifth energy level thereto.

18. The apparatus according to claim 17 wherein the means for providing further comprises:
   means for radiating at least the selected portion of the active medium.

19. The apparatus according to claim 16 comprising:
   means for providing a fifth energy level, less than the third threshold energy level but not more than the second threshold energy level less, to at least the selected portion of the active medium;
   wherein the third and the fourth radiation means become sufficient in combination with the means for providing the fifth energy level so as to cause the selected portion of the active medium to transition from the second to the first molecular form.

20. The apparatus according to claim 19 wherein the means for providing comprises:
   means for elevating the temperature of the active medium so as to provide the fifth energy thereto.

21. The apparatus according to claim 19 wherein the means for providing comprises:
   means for radiating at least the selected portion of the active medium.

22. The apparatus according to claim 16 comprising:
   means for providing a fifth energy level, less than the third threshold energy level but not more than the first threshold energy level less, to the selected portion of the active medium;
   wherein the first and the second radiation means become sufficient in combination with the means for providing the fifth energy level so as to cause the selected portion of the active medium to transition from the second to the first isomeric form.

23. The apparatus according to claim 22 wherein the means for providing comprises:
   means for elevating the temperature of the active medium.

24. The apparatus according to claim 22 wherein the means for providing comprises:
   means for radiating at least the selected portion of the active medium.

25. The apparatus according to claim 16 wherein the providing means comprises:
   means for directing radiation of an energy level at least equal to the third threshold energy level to only selected portions of the active medium to erase only the selected portions by changing only the selected portions to the first isomeric form.

26. The apparatus according to claim 25
   wherein the means for directing is directing radiation of a sixth energy level, less than the third threshold energy level to the selected portion, and is simultaneously directing radiation of a seventh energy level, less than the third threshold energy level, to the selected portion;
   wherein the combined energies of the sixth energy level radiation and the seventh energy level radiation are at least equal to the third threshold energy level;
   wherein the means for directing the radiation of the sixth energy level, and the means for simultaneously directing radiation of the seventh energy level, jointly cause the selected portion to change from its second to its first isomeric form by process of two-photon absorption.

27. The apparatus according to claim 9
   wherein the plurality of portions of the active medium are three-dimensionally arrayed substantially as a parallelpiped body.

28. The apparatus according to claim 9
   wherein the active medium, sensitive to radiation, is dispersed in a three-dimensional matrix, substantially transparent to electromagnetic radiation and capable of maintaining a relatively stable shape containable within a volume.

29. The apparatus according to claim 28
   wherein the active medium is photochromic.

30. The apparatus according to claim 9
   wherein the plural-photon absorption is two-photon absorption.

31. A method of reading and writing an active medium with binary information comprising:
   spatially and temporally simultaneously illuminating by intersection of a first pair of radiation beams a selected region of a volume of active medium to cause, by process of two-photon absorption, a change in the active medium at the intersection region from a first to a second isomeric form,
   wherein at least one of the first pair of radiation beams passes through an additional volume of active medium not at the intersection region and is insufficient to cause any change of the isomeric molecular form of this additional volume of active medium; and
   subsequently spatially and temporally simultaneously illuminating by intersection of a second pair of radiation beams the active medium at the intersection region to cause, by process of two-photon excitation, the fluorescence of the active medium at the intersection region,
   wherein at least one of the second two radiation beams passes through an additional volume of the active medium not at the intersection region and is individually insufficient to cause any fluorescence of this additional volume of active medium.

32. The method according to claim 31 wherein each of the first pair of radiation beams passes through an additional volume of the active medium not at the intersection region while being individually insufficient to cause any change of the isomeric form within the additional volume of active medium.

33. The method according to claim 31 wherein each of the second pair of radiation beams passes through an additional volume of the active medium not at the intersection region while being individually insufficient to cause fluorescence within the additional volume of active medium.

34. An apparatus for employing a one-dimensional inhomogeneity pattern upon a line within a physical body of material, the apparatus comprising:

a three-dimensional body of radiation-sensitive active material exhibiting at separate times at least a first and a second substantially stable isomeric forms and responsive to sufficiently energetic radiation energy to change between such forms;

means for providing first-frequency radiation to selected discrete regions on a first plane within the three-dimensional body, the first-frequency radiation being individually insufficiently energetic so as to induce the material to change from its first to its second isomeric form;

means for providing second-frequency radiation to selected discrete regions on a second plane intersecting the first plane along a line within the three-dimensional body, the second-frequency radiation being individually insufficiently energetic so as to induce the material to change from its first to its second isomeric form;

wherein the first-frequency radiation and the second-frequency radiation temporally simultaneously energize discrete regions along a line within the three-dimensional body of material, the coinciding first-frequency radiation and the second-frequency radiation being jointly sufficiently energetic so as to excite the material at these discrete regions by process of two-photon absorption to change from its first to its second isomeric form;

wherein other discrete regions of the three-dimensional body of material that are not along the line are not changed in isomeric molecular form.

35. The apparatus according to claim 34 wherein the means for providing first-frequency radiation so provides first-frequency radiation to selected discrete regions on a plurality of first planes within the physical body, which plurality of first planes intersect the second plane along a plurality of lines within the physical body;

wherein the plurality of lines are simultaneously energized by the second-frequency source in order to change these discrete regions in isomeric molecular form and thereby form a two-dimensional pattern in a plane containing the plurality of lines.

36. The apparatus according to claim 35 wherein the means for providing second-frequency radiation is so providing the second-frequency radiation to the selected discrete regions on a plurality of second planes within the physical body, which plurality of second planes intersect the plurality of first planes along a multiplicity of points within the physical body, so as to form a three-dimensional pattern in a volume within the body.

37. The apparatus according to claim 34 further comprising:

means for detecting the one-dimensional pattern emplaced upon the line within the physical body of material, thereby to serve as a one-dimensional optical memory;

means for providing third-frequency radiation to the selected discrete regions on the first plane within the physical body, the third-frequency radiation being individually insufficiently energetic so as to excite either the first or the second isomeric forms of the active material to fluoresce;

means for providing a fourth-frequency radiation to the selected discrete regions on the second plane within the physical body, the fourth-frequency radiation being individually insufficiently energetic so as to excite either the first or the second isomeric forms of the active material to fluoresce;

wherein the temporal and spatial coincidence of the third-frequency radiation and the fourth-frequency radiation at discrete regions of the physical body is sufficiently energetic so as to excite via process of two-photon excitation the second isomeric form of the active material at these discrete regions to fluoresce but is insufficiently energetic so as to cause the first stable isomeric form of the active material at these discrete regions to fluoresce;

wherein the detection or non-detection of fluorescence by the detector means respectively indicates whether a discrete region of the active material at which the third-frequency radiation and the fourth-frequency radiation are temporally and spatially coincident contains the first, or the second, isomeric form of the active material.

38. A writable and readable binary memory, comprising:

a photochromic material capable of exhibiting a first and a second substantially stable isomeric form, said material absorbing in its first form light of a first energy level in order to isomerize to its second stable isomeric form and thereafter tending to remain in this second stable isomeric form, said material absorbing in its second isomeric form light of a second energy level in order to fluoresce while remaining in its second isomeric form;

means for selectively providing and directing onto the photochromic material a first-frequency light, lower in energy level than either of the first and the second energy levels, the first-frequency light being unable individually to cause either the isomerization or the fluorescence of the photochromic material;

means for selectively providing and directing onto the photochromic material at the first time, a second-frequency light, lower in energy level than either of the first and the second energy levels, said second-frequency light being unable individually to cause either the isomerization or the fluorescence of the photochromic material;

wherein the first-frequency and the second-frequency light together cause, by process of two-photon absorption, the isomerization of a photochromic material that is in its first isomeric form to its second isomeric form, or the fluorescence of the photochromic material that is in its second isomeric form;

means for selectively providing and directing onto a photochromic material at a second time, a third-frequency light, lower in energy level than either of the first energy level and the second energy level, the third-frequency light being unable individually to cause either the isomerization or the fluorescence of the photochromic material;

means for selectively providing and directing onto the photochromic material at the second time a fourth-frequency light, lower in energy level than either of the first energy level and the second energy level, said fourth-frequency light being unable individually to cause either the isomerization or the fluorescence of the photochromic material;

wherein the third-frequency and the fourth-frequency light together cause, by process of two-photon absorption, the fluorescence of the photochromic material when it is in its second isomeric form, but cause no change in the photochromic material when it is in its first isomeric form.

39. In a method of producing a three-dimensional inhomogeneity pattern in a volume of material by selectively radiating the material with directed beams of electromagnetic radiation, a material comprising:

a three-dimensional matrix, substantially transparent to electromagnetic radiation and capable of maintaining a relatively stable shape; and an active medium substantially dispersed in said matrix, the active medium being responsive to electromagnetic radiation above a first threshold energy level to change molecular form, and being responsive to energy changes of a first level, at least equal to the first threshold energy level, at selected regions resultant from plural-photon absorption, to change from a substantially stable first molecular form to a substantially stable second molecular form, the changed selected regions of the medium defining a first binary state of stored data and the remaining, unchanged, first-molecular-form regions of the medium defining a second binary state of stored data.

40. The material according to claim 39 wherein the medium's second molecular form is substantially transparent to electromagnetic radiation.

41. The material according to claim 39 wherein the plural-photon absorption is two-photon absorption.

42. The material according to claim 41 wherein a first absorbed photon is of a first-photon energy level that is less than half the first threshold energy level; and a second absorbed photon is of a second-photon energy level that is more than half the first threshold energy level, the combined energy levels of the first and the second absorbed photons exceeding the first threshold energy level.

43. The material according to claim 41 wherein the first threshold energy level is in the ultraviolet.

44. The material according to claim 43 wherein the first threshold energy level is greater than or equal to the energy of a photon of 355 nanometers wavelength.

45. The material according to claim 42 wherein the two-photon absorption is of a first photon of an energy greater than or equal to a photon of 1064 nm wavelength, and of a second photon of an energy greater than or equal to a photon of 532 nm wavelength, to produce energy changes at a first level greater than or equal to the energy of a 355 nm wavelength photon.

46. The material according to claim 39 wherein the medium's second molecular form is substantially non-responsive to electromagnetic radiation below a second threshold energy level that is less than the first threshold energy level.

47. The material according to claim 46 wherein the medium's second molecular form is responsive to energy changes of a second level, greater than or equal to the second threshold energy level but less than the first threshold energy level, to fluoresce.

48. The material according to claim 47 wherein the medium remains in its second molecular form responsive to energy changes of the second level, and after fluorescing.

49. The material according to claim 48 wherein the second energy threshold level is in the visible.

50. The material according to claim 49 wherein the second energy threshold is greater than or equal to the energy of a photon of 532 nanometers wavelength.

51. The material according to claim 50 wherein the mediums second molecular form is responsive to energy changes of the second level resultant from plural photon absorption.

52. The material according to claim 51 wherein the plural-photon absorption is two-photon absorption.

53. The material according to claim 52 wherein the two-photon absorption, producing energy changes at a second level greater than or equal to the energy of a photon of 532 nm wavelength, is of a first photon having an energy greater than or equal to a photon of 1064 nm wavelength, and of a second photon also having an energy greater than or equal to a photon of 1064 nm wavelength.

54. The material according to claim 47 wherein both the medium's second molecular form is substantially responsive to electromagnetic radiation of a third level above a third threshold energy level to change to the first molecular form.

55. The material according to claim 54 wherein the third energy threshold level is in the infrared.

56. The material according to claim 55 wherein the third energy threshold is greater than or equal to the energy of a photon of 2.12 microns wavelength.

57. The material according to claim 56 wherein the medium's second molecular form is so responsive to energy changes of the third level by plural-photon absorption.

58. The material according to claim 57 wherein the plural-photon absorption to produce energy changes of the third level is two-photon absorption.

59. The material according to claim 58 wherein the two photon absorption, producing energy changes of a third level greater than or equal to the energy of a photon of 2.12 microns wavelength, is of a first photon having an energy greater than or equal to a portion of 1.06 micron wavelength, and of a second photon having an energy greater than or equal to a photon of 1.06 micron wavelength.

60. The material according to claim 39 wherein the medium is photochromic.

61. The material according to claim 60 wherein the photochromic medium consists essentially of spirobenzopyran.

62. The material according to claim 39 wherein the matrix comprises:
a polymer.

63. The material according to claim 39 wherein the active medium comprises:
a monomer.

64. The material according to claim 63 wherein the monomer comprises:
styrene

65. For use in a method of producing a three-dimensional inhomogeneity pattern in a volume of material by selectively radiating the material with directed beams of electromagnetic radiation, a material consisting essentially of:
an active medium
capable of maintaining a relatively stable shape containable within a volume,
substantially transparent to electromagnetic radiation below a threshold energy level,
responsive to energy level changes resultant from plural-photon virtual absorption at selected locations within the volume so as to change from a first molecular structure to another, second, inhomogeneous and substantially persistent molecular structure at these selected locations, and
substantially persistent at the selected locations after change of molecular structure so as to constitute, and so as to preserve, an inhomogeneity pattern at these selected locations.

66. The patternable material according to claim 65 wherein the second molecular structure is substantially transparent to electromagnetic radiation below the threshold level.

67. The patternable material according to claim 65 wherein the medium's first molecular structure is a liquid.

68. The patternable material according to claim 67 wherein the medium's second molecular structure is a solid.

69. The patternable material according to claim 65 wherein the medium's first molecular structure consists essentially of:
a monomer.

70. The patternable material according to claim 69 wherein the medium's second molecular structure consists essentially of:
a polymer.

71. The patternable material according to claim 70 wherein the monomer is liquid and the polymer is substantially solid.

72. The patternable material according to claim 65 wherein the active medium is responsive to energy level changes resultant from two-photon virtual absorption.

73. A method of forming a substantially persistent three-dimensional shape comprising:
containing a volume of a medium reactive to electromagnetic radiation;
first-illuminating with a first beam of electromagnetic radiation selected locations within the medium, the first beam being insufficiently energetic so as to cause a change in the medium through which it passes;
second-illuminating with a second beam of electromagnetic radiation at least some of the selected locations within the medium, the second beam being insufficiently energetic so as to cause a change in the medium through which it passes, simultaneously that these some selected locations are illuminated by the first beam;
therein by the simultaneous first-illuminating and second-illuminating causing by a two-photon absorption process at these some selected locations the medium to change to a different isomeric molecular form, the some selected locations collectively forming a substantially persistent three-dimensional shape.

74. The method according to claim 73
wherein the containing is of a volume of liquid medium; and
wherein the simultaneous illuminatings at the some selected locations cause the liquid medium to change to a different isomeric molecular form that is substantially solid.

75. The method according to claim 74 further comprising:
draining the remaining liquid medium not converted to the substantially solid molecular form from the volume, leaving exposed a substantially solid three dimensional shape.

76. A method for generating a substantially persistent three-dimensional inhomogeneity pattern in a volume of medium in response to energy level changes within such medium stimulated by directed electromagnetic energy input, the method comprising:
illuminating with a first beam of electromagnetic radiation first selected regions within a volume of medium, the first beam being insufficiently energetic so as to cause a change in the medium through which it passes substantially unreflected and undispersed and unabsorbed;
illuminating with a second beam of electromagnetic radiation second selected regions within the volume of medium, the second beam being insufficiently energetic so as to cause a change in the medium through which it passes substantially unreflected and undispersed and unabsorbed;
wherein at least some of the second selected regions are identical to some of the first selected regions and are illuminated by the first and the second beam simultaneously;
wherein the identical regions are responsive to this simultaneously illuminating so as to change by process of two-photon absorption from one isomeric molecular form to another, substantially persistent, molecular form that is inhomogeneous with the first molecular form;
wherein the simultaneously-illuminated inhomogeneous-molecular-form substantially-persistent regions collectively form a three-dimensional pattern.

77. A method of generating a visually perceptible three-dimensional image comprising:
containing a volume of substantially visually transparent medium capable of maintaining a relatively stable shape;
illuminating with a first beam of electromagnetic radiation selected regions within the medium, the first beam being insufficiently energetic so as to cause a change in the medium through which it passes substantially unreflected and undispersed;

illuminating with a second beam of electromagnetic radiation at least some of the selected regions within the medium, this second beam being insufficiently energetic so as to cause a change in the medium through which it passes substantially unreflected and undispersed, simultaneously that these some selected regions are illuminated by the first beam;

therein to cause by process of two-photon absorption at these some selected regions the medium to change from the substantially transparent to a substantially opaque molecular form;

wherein the some selected regions collectively forming a visually perceptible three-dimensional image.

78. The method according to claim 77 after the illuminatings with the first and the second beam further comprising:

illuminating with a third beam of electromagnetic radiation the selected regions within the medium, the third beam being insufficiently energetic so as to cause a change in the medium through which it passes substantially unreflected and undispersed;

illuminating with a fourth beam of electromagnetic radiation the selected regions within the medium, this fourth beam being insufficiently energetic so as to cause a change in the medium through which it passes substantially unreflected and undispersed, simultaneously that these selected regions are illuminated by the third beam so as to cause by process of two-photon absorption at these selected regions the medium to change back from its substantially opaque molecular form to its substantially transparent molecular form.

* * * * *

UNITED STATES PATENT AND TRADEMARK OFFICE
CERTIFICATE OF CORRECTION

PATENT NO.     : 5,268,862                                      Page 1 of 1
DATED          : December 7, 1993
INVENTOR(S)    : Peter M. Rentzepis It is certified that error appears in the above-identified patent and that said Letters Patent is hereby corrected as shown below:

<u>Column 1,</u>
Line 2, add as a new section before the BACKGROUND OF THE INVENTION section:

-- RIGHTS IN THE U.S. GOVERNMENT

The present invention was developed under grant No. F30602-97-C-0014 between the United States Air Force (USAF) acting through its Office of Special Research (AFOSR) and The Regents of the University of California. The U.S. Government has a paid-up license in this invention and the right in limited circumstances to require the patent owner to license others on reasonable terms as provided for by the terms of the above-stated contract awarded by AFOSR. --.

Signed and Sealed this

Eighteenth Day of February, 2003

JAMES E. ROGAN
*Director of the United States Patent and Trademark Office*